(12) United States Patent
Yamada

(10) Patent No.: US 8,927,115 B2
(45) Date of Patent: Jan. 6, 2015

(54) ORGANIC ELECTROLUMINESCENT DEVICE

(75) Inventor: Takeshi Yamada, Tsukuba (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 1288 days.

(21) Appl. No.: 12/440,626

(22) PCT Filed: Sep. 10, 2007

(86) PCT No.: PCT/JP2007/068008
§ 371 (c)(1),
(2), (4) Date: Mar. 26, 2009

(87) PCT Pub. No.: WO2008/032843
PCT Pub. Date: Mar. 20, 2008

(65) Prior Publication Data
US 2009/0212693 A1    Aug. 27, 2009

(30) Foreign Application Priority Data

Sep. 14, 2006 (JP) .................................. 2006-249183

(51) Int. Cl.
| | | |
|---|---|---|
| H05B 33/14 | (2006.01) | |
| H01J 9/00 | (2006.01) | |
| C08G 73/02 | (2006.01) | |
| C08G 61/12 | (2006.01) | |
| H01L 51/00 | (2006.01) | |
| H05B 33/22 | (2006.01) | |
| H01L 51/50 | (2006.01) | |

(52) U.S. Cl.
CPC ............. *C08G 73/026* (2013.01); *C08G 61/12* (2013.01); *C08G 61/123* (2013.01); *C08G 61/126* (2013.01); *H01L 51/0043* (2013.01); *H05B 33/14* (2013.01); *H05B 33/22* (2013.01); *C08G 2261/3142* (2013.01); *C08G 2261/3162* (2013.01); *C08G 2261/3223* (2013.01); *C08G 2261/3246* (2013.01); *C08G 2261/5222* (2013.01); *H01L 51/0035* (2013.01); *H01L 51/0036* (2013.01); *H01L 51/0039* (2013.01); *H01L 51/0085* (2013.01); *H01L 51/0087* (2013.01); *H01L 51/0089* (2013.01); *H01L 51/5036* (2013.01); *H01L 51/5048* (2013.01)
USPC ............................... 428/690; 445/58; 548/440

(58) Field of Classification Search
None
See application file for complete search history.

(56) References Cited

U.S. PATENT DOCUMENTS

| 5,514,878 A | 5/1996 | Holmes et al. |
|---|---|---|
| 2002/0098379 A1 | 7/2002 | Arakane et al. |
| 2003/0143429 A1 | 7/2003 | Suzuki et al. |
| 2004/0158017 A1 | 8/2004 | O'Dell et al. |
| 2005/0048314 A1 | 3/2005 | Antoniadis et al. |
| 2005/0074629 A1 | 4/2005 | Forrest et al. |
| 2005/0186106 A1 | 8/2005 | Li et al. |
| 2005/0276994 A1 | 12/2005 | Iwawaki et al. |
| 2006/0054886 A1 | 3/2006 | Bazan et al. |
| 2007/0184301 A1* | 8/2007 | Oshiyama et al. ............ 428/690 |
| 2008/0197768 A1 | 8/2008 | Conway et al. |
| 2009/0174311 A1* | 7/2009 | Patel et al. ..................... 313/504 |

FOREIGN PATENT DOCUMENTS

| JP | 03-273087 A | 12/1991 |
|---|---|---|
| JP | 2000-160328 A | 6/2000 |
| JP | 2000-252076 A | 9/2000 |
| JP | 2000252076 A * | 9/2000 |
| JP | 2001-52867 A | 2/2001 |
| JP | 2001-110569 A | 4/2001 |
| JP | 2002-198183 A | 7/2002 |
| JP | 2003-45664 A | 2/2003 |
| JP | 2004-527628 A | 9/2004 |
| JP | 2004247313 A | 9/2004 |
| JP | 2005-243300 A | 9/2005 |
| JP | 2005243300 A * | 9/2005 |
| JP | 2006-32883 A | 2/2006 |
| WO | 94/29883 A1 | 12/1994 |
| WO | 2005/059951 A2 | 6/2005 |
| WO | WO 2005059951 A2 * | 6/2005 |
| WO | WO 2005083033 A1 * | 9/2005 |

OTHER PUBLICATIONS

Machine English translation of JP 2000-252076 A. Mar. 2, 2012.*
Machine English translation of JP 2005-243300 A. Mar. 2, 2012.*
Extended European Search Report issued in EP 07807412.7 dated Oct. 12, 2010.
European Patent Office, "Communication Pursuant to Article 94(3) EPC," issued in connection with European Patent Application No. 07 807 412.7, dated Jul. 30, 2012.
Japanese Patent Office, "Office Action" issued in connection with Japanese Patent Application No. 2007-225588, dated Jun. 12, 2012.

* cited by examiner

*Primary Examiner* — J. L. Yang
(74) *Attorney, Agent, or Firm* — Sughrue Mion, PLLC

(57) ABSTRACT

An organic electroluminescent device excellent in light emission efficiency and driving voltage, having electrodes composed of an anode and a cathode, a first organic layer arranged in contact with or adjacent to the anode between the electrodes and containing a hole transporting polymer compound and a second organic layer arranged in contact with the first organic layer between the first organic layer and the cathode and containing an electron transporting polymer compound, wherein the hole transporting polymer compound and the electron transporting polymer compound are regulated by specific parameters, at least one of the first organic layer and the second organic layer contains a light emitting material regulated by specific parameters, and light of specific color is emitted from the first organic layer or from the first organic layer or the second organic layer.

23 Claims, No Drawings

ORGANIC ELECTROLUMINESCENT DEVICE

TECHNICAL FIELD

The present invention relates to an organic electroluminescent device, particularly, to a laminated polymer organic electroluminescent device.

BACKGROUND ART

Recently, organic electroluminescent devices are paid to attention since multi color light emission is obtained easily with the devices in addition to low voltage driving and high luminance. As one of materials used for manufacturing of organic electroluminescent devices, a polymer material is investigated.

As an organic electroluminescent device obtained by laminating this polymer material, suggested are devices obtained by laminating polyphenylene vinylene and alkoxy-substituted polyphenylene vinylene, devices obtained by laminating polyphenylene vinylene and cyanated polyphenylene vinylene, and the like (JP-A No. 3-273087, WO 94/029883). These devices, however, have a problem that sufficient light emission efficiency is not obtained.

Additionally, an organic electroluminescent device obtained by laminating an anode, organic light emitting layer (specifically, composed of a hole transporting polymer layer containing a hole transporting material situated at the anode side, and a light emitting polymer layer laminated on this hole transporting polymer layer and not containing the hole transporting material and containing a dopant light emitting material situated at the electron transporting layer side), electron transporting layer and cathode is also suggested (JP-A No. 2001-052867). However, this device has a problem that sufficient performances are not obtained from the standpoint of light emission efficiency and driving voltage.

DISCLOSURE OF THE INVENTION

An object of the present invention is to provide an organic electroluminescent device excellent in light emission efficiency and driving voltage.

The present inventors have intensively studied to solve the above-described problem, leading to completion of the present invention.

Firstly, the present invention provides an organic electroluminescent device having electrodes composed of an anode and a cathode, a first organic layer arranged in contact with or adjacent to the anode between the electrodes and containing a hole transporting polymer compound and a second organic layer arranged in contact with the first organic layer between the first organic layer and the cathode and containing an electron transporting polymer compound, wherein the hole transporting polymer compound satisfies the following formula (1):

$$Ip1-Wa<0.5 \quad (1)$$

(wherein, Ip1 represents the absolute value (eV) of the ionization potential of the hole transporting polymer compound, and Wa represents the absolute value (eV) of the work function of the anode.), the electron transporting polymer compound satisfies the following formula (2) and the following formula (3):

$$Wc-Ea2<0.5 \quad (2)$$

$$Ip2-Wa \geq 0.5 \quad (3)$$

(wherein, Wc represents the absolute value (eV) of the work function of the cathode, Ea2 represents the absolute value (eV) of the electron affinity of the electron transporting polymer compound, Ip2 represents the absolute value (eV) of the ionization potential of the electron transporting polymer compound, and Wa has the same meaning as described above.), at least one of the first organic layer and the second organic layer contains a light emitting material satisfying the following formula (4) and the following formula (5):

$$|Ip3-Ip1|<0.5 \quad (4)$$

$$|Ea2-Ea3|<1.0 \quad (5)$$

(wherein, Ip3 represents the absolute value (eV) of the ionization potential of the light emitting material, Ea3 represents the absolute value (eV) of the electron affinity of the light emitting material, and Ip1 and Ea2 have the same meanings as described above.), and light is emitted from the first organic layer or from the first organic layer and the second organic layer, in a color range in which values of x and y on the CIE chromatic coordinate satisfy the following formula (P) or the following formula (O):

$$x<0.28 \text{ or } x>0.44 \text{ and } y \geq 0 \quad (P)$$

$$0.28 \leq x \leq 0.44 \text{ and } y \leq 0.24 \text{ or } y \geq 0.46 \quad (Q).$$

Secondly, the present invention provides a method of producing the above-described organic electroluminescent device, wherein the method comprises insolubilizing the above-described first organic layer, then, providing the second organic layer in contact with the insolubilized first organic layer.

Thirdly, the present invention provides a sheet light source and a display obtained by using the above-described organic electroluminescent device or an organic electroluminescent device obtained by the above-described production method.

MODES FOR CARRYING OUT THE INVENTION

Organic Electroluminescent Device

The organic electroluminescent device of the present invention is a device having electrodes composed of an anode and a cathode, a first organic layer arranged in contact with or adjacent to the anode between the electrodes and containing a hole transporting polymer compound and a second organic layer arranged in contact with the first organic layer between the first organic layer and the cathode and containing an electron transporting polymer compound, wherein the hole transporting polymer compound satisfies the above-described formula (1), the electron transporting polymer compound satisfies the above-described formula (2) and the above-described formula (3), at least one of the first organic layer and the second organic layer contains a light emitting material satisfying the above-described formula (4) and the above-described formula (5), and light is emitted from the first organic layer or from the first organic layer and the second organic layer, in a color range in which values of x and y on the CIE chromatic coordinate satisfy the above-described formula (P) or the above-described formula (Q). Here, "arranged in contact with or adjacent to the anode" means both of a case of arrangement in contact directly with the anode and a case of arrangement near and not in contact with the anode.

In the present specification, the ionization potential and electron affinity of the hole transporting polymer compound, electron transporting polymer compound and light emitting material are measured by a cyclic voltammetry method. In measurement, a glass carbon electrode is used as an active electrode, platinum is used as a counter electrode, and Ag/Ag$^+$ is used as a reference electrode, and a substance to be measured is cast to form a thin film on the active electrode. Measurement of potential is carried out in an acetonitrile solution of 0.1 M tetrafluoroboric acid tetra-n-butyl ammonium [CH$_3$(CH$_2$)$_3$]$_4$N.BF$_4$. The scanning range is 0 to 1500 mV for the oxidation side and −2900 mV to 0 mV for the reduction side. The oxidation potential and reduction potential are read from a displacement point of curve of the potential wave. The absolute value of the ionization potential (Ip) and the absolute value of the electron affinity (Ea) are calculated from the value of oxidation potential and the value of reduction potential according to the following formulae.

$$Ip=[(\text{oxidation potential})+0.45+4.5] \text{ eV}$$

$$Ea=[(\text{reduction potential})+0.45+4.5] \text{ eV}$$

In the present specification, the value of the work function of an anode is measured at a point of initiation of photoelectron emission by ultraviolet ray emitted from a deuterium lamp, using a photoelectron spectrometer (manufactured by RIKEN KEIKI Co., Ltd., trade name: AC-2).

In the present specification, a value obtained by measurement by a thermoelectron emission method is used as the work function of a cathode, however, when measurement by a thermoelectron emission method is impossible, a value obtained by measurement by a photoelectron emission method is used.

The above-described formula (1) represents a difference between the absolute value Ip1 of the ionization potential of a hole transporting polymer compound and the absolute value Wa of the work function of an anode. The difference is less than 0.5 eV, and preferably less than 0.47 eV, more preferably less than 0.3 eV from the standpoint of easiness of injection of holes from an anode or adjacent one or more layers into a first organic layer containing a hole transporting polymer compound.

The above-described formula (2) represents a difference between the absolute value Wc of the work function of a cathode and the absolute value Ea2 of the electron affinity of an electron transporting polymer compound. The difference is less than 0.5 eV, and preferably less than 0.35 eV, more preferably less than 0.3 eV from the standpoint of easiness of injection of electrons from a cathode into a second organic layer containing an electron transporting polymer compound.

The above-described formula (3) represents a difference between the absolute value Ip2 of the ionization potential of an electron transporting polymer compound and the absolute value Wa of the work function of an anode. The difference is 0.5 eV or more, and preferably from 0.7 to 1.5 eV, more preferably 0.9 to 1.2 eV from the standpoint of providing a gap between the ionization potential Ip1 and the ionization potential Ip2 of the first organic layer to block holes, thereby promoting re-bonding in the first organic layer, and from the standpoint of injection of residual holes into the second organic layer to cause re-bonding in the layer.

The above-described formula (4) represents the absolute value of a difference between the absolute value Ip3 of the ionization potential of a light emitting material and the absolute value Ip1 of the ionization potential of a hole transporting polymer compound. The absolute value of the difference is less than 0.5 eV, and preferably less than 0.3 eV, more preferably less than 0.2 eV from the standpoint of easiness of injection of holes from a hole transporting polymer compound into a light emitting material.

The above-described formula (5) represents the absolute value of a difference between the absolute value Ea2 of the electron affinity of an electron transporting polymer compound and the absolute value Ea3 of the electron affinity of a light emitting material. The absolute value of the difference is less than 1.0 eV, and preferably less than 0.98 eV, more preferably less than 0.7 eV from the standpoint of easiness of injection of electrons from an electron transporting polymer compound into a light emitting material.

The above-described formulae (P) and (Q) define emission colors of an organic electroluminescent device of the present invention, by values of x and y on the CIE chromatic coordinate. An emission color satisfying this range is not so-called white, but one which is obtained from light emission of narrower spectrum width, thus, a primary color itself of light (namely, red, blue or green) or a color close to them.

In the organic electroluminescent device of the present invention, the anode is usually transparent or semi-transparent. As such an anode, for example, metal oxides, metal sulfides or metals showing high electric conductivity can be used. Usually, these are made into thin films. As the anode, those of high light transmission can be suitably used, and the anode may be selected appropriately depending on the kinds of other organic layers. As the material of the anode, for example, films (NESA and the like) formed using electric conductive glass composed of indium oxide, zinc oxide, tin oxide, and composite thereof: indium•tin•oxide (ITO), indium•zinc•oxide and the like, and gold, platinum, silver, copper and the like are used, and ITO, indium•zinc•oxide, tin oxide are preferable. For manufacturing an anode, a vacuum vapor-deposition method, sputtering method, ion plating method, plating method and the like are used. As the anode, organic transparent electric conductive films made of polyaniline or its derivatives, polythiophene or its derivatives, and the like may be used. The anode may be composed one layer or two or more layers. The above-described materials of the anode may be used singly or in combination of two or more.

The thickness of the anode can be appropriately regulated in view of light transmission and electric conductivity, and it is, for example, from 10 nm to 10 μm, preferably 20 nm to 1 μm, further preferably 50 nm to 500 nm.

In the organic electroluminescent device of the present invention, a hole injection layer (usually, a layer having an average thickness of from 1 to 200 nm) may be formed separately from the first organic layer on the anode, for making electric charge injection easier. In this case, the hole injection layer can be formed using a material such as known electric conductive polymers (phthalocyanine derivative, polythiophene derivative and the like), aromatic amine-containing polymers, copper phthalocyanine, molybdenum oxide, amorphous carbon, polyamine compounds and the like. Further, a layer (usually, a layer having an average thickness of 2 nm or less) made of a metal oxide, metal fluoride, organic insulation material and the like may be provided.

In the organic electroluminescent device of the present invention, the cathode is usually transparent or semi-transparent. As the material of such a cathode, materials of small work function are preferable, and for example, alkali metals such as lithium, sodium, potassium, rubidium, cesium and the like, alkaline earth metals such as beryllium, magnesium, calcium, strontium, barium and the like, metals such as aluminum, scandium, vanadium, zinc, yttrium, indium, cerium, samarium, europium, terbium, ytterbium and the like, alloys made of two or more of them, or alloys made of at least one of them and at least one of gold, silver, platinum, copper, manganese, titanium, cobalt, nickel, tungsten and tin, and graphite, graphite intercalation compounds and the like are used. Examples of the alloy include magnesium-silver alloy, magnesium-indium alloy, magnesium-aluminum alloy, indium-silver alloy, lithium-aluminum alloy, lithium-magnesium alloy, lithium-indium alloy, calcium-aluminum alloy and the like. The cathode may be composed one layer or two or more layers. The above-described materials of the cathode may be used singly or in combination of two or more.

The thickness of the cathode can be appropriately regulated in view of electric conductivity and durability, and it is, for example, from 10 nm to 10 μm, preferably 20 nm to 1 μm, further preferably 50 nm to 500 nm.

For manufacturing of the cathode, a vacuum vapor-deposition method, sputtering method, lamination method of thermally press-fitting a metal thin film, and the like are used. In the organic electroluminescent device of the present invention, an electron injection layer (usually, a layer having an average thickness of 2 nm or less) other than the second organic layer may be constituted on the cathode. In this case, the electron injection layer can be formed using organic materials doped with an alkali metal or alkaline earth metal, materials such as salts, complexes and the like of these metals with organic acids, electric conductive polymers, metal oxides, metal fluorides, organic insulation materials and the like. After manufacturing of the cathode, a protective layer may be further provided to protect the device.

In the organic electroluminescent device of the present invention, the above-described electrodes, first organic layer, second organic layer and the like are usually formed on a substrate. This substrate may advantageously be one which does not change in forming an electrode and in forming an organic layer, examples of the material thereof include glass, plastic, polymer film, silicon and the like and transparent or semi-transparent materials are preferable. In the case of an opaque substrate, it is preferable that the opposite electrode (namely, electrode at far side from the substrate) is transparent or semi-transparent. As the substrate, flat and fibrous substrates can be used.

The order of forming the anode and the cathode on the substrate is not particularly restricted, and can be appropriately selected depending on the device structure of top emission type and bottom emission type.

In the organic electroluminescent device of the present invention, the hole transporting polymer compound to be contained in the first organic layer is not particularly restricted in its material providing it satisfies the above-described formulae (1) to (5), and usually, it has a function by which holes are injected from an anode or from another layer on the anode side, and transported, and for example, can be appropriately selected from π and σ conjugated polymers, and polymer materials containing an amine compound. The hole transporting polymer compounds may be used singly or in combination of two or more.

Examples of the hole transporting polymer compound include those selected from materials described in "Polymer EL Material" (collectively-written by Toshihiro Onishi, Tamami Koyama, Kyoritsu Publication, 2004, first edition, first printing) p. 33 to 58, and specific examples include those selected from polyfluorene, derivatives and copolymers thereof, polyarylene, derivatives and copolymers thereof, polyarylenevinylene, derivatives and copolymers thereof, and (co)polymers of aromatic amines and derivatives thereof, disclosed in WO 99/13692, WO 99/48160, GB 2340304A, WO 00/53656, WO 01/19834, WO 00/55927, GB2348316, WO 00/46321, WO 00/06665, WO 99/54943, WO 99/54385, U.S. Pat. No. 5,777,070, WO 98/06773, WO 97/05184, WO 00/35987, WO 00/53655, WO 01/34722, WO 99/24526, WO 00/22027, WO 00/22026, WO 98/27136, U.S. Pat. No. 573,636, WO 98/21262, U.S. Pat. No. 5,741,921, WO 97/09394, WO 96/29356, WO 96/10617, EP 0707020, WO 95/07955, JP-A No. 2001-181618, JP-A No. 2001-123156, JP-A No. 2001-3045, JP-A No. 2000-351967, JP-A No. 2000-303066, JP-A No. 2000-299189, JP-A No. 2000-252065, JP-A No. 2000-136379, JP-A No. 2000-104057, JP-A No. 2000-80167, JP-A No. 10-324870, JP-A No. 10-114891, JP-A No. 9-111233, JP-A No. 9-45478 and the like.

Of them, hole transporting polymer compounds (hereinafter, referred to as "polyarylene hole transporting polymer compound") having a repeating unit composed of an arylene group optionally having a substituent, and/or a repeating unit composed of a divalent heterocyclic group optionally having a substituent are preferable. In the polyarylene hole transporting polymer compound, the total proportion of "repeating unit composed of an arylene group optionally having a substituent and repeating unit composed of a divalent heterocyclic group optionally having a substituent" occupying all repeating units is preferably from 20 to 100 mol %, further preferably 50 to 99 mol % from the standpoint of hole mobility. Here, the number of carbon atoms constituting a ring of the arylene group is usually about from 6 to 60. "The number of carbon atoms constituting a ring" does not include the carbon number of substituents described later, being applicable also in the following descriptions. Specific examples of the arylene group include a phenylene group, biphenylene group, terphenylene group, naphthalenediyl group, anthracenediyl group, phenanthrenediyl group, pentalenediyl group, indenediyl group, heptalenediyl group, indacenediyl group, triphenylenediyl group, binaphthyldiyl group, phenylnaphthylenediyl group, stilbenediyl group, fluorenediyl group and the like. The divalent heterocyclic group means an atomic group obtained by removing two hydrogen atoms from a heterocyclic compound. The number of carbon atoms constituting a ring of the divalent heterocyclic group is usually about from 3 to 60. Specific examples of the divalent heterocyclic group include a pyridine-diyl group, diazaphenylene group, quinolinediyl group, quinoxalinediyl group, acridinediyl group, bipyridyldiyl group, phenanthrolinediyl group, groups of the following formula (6b) in which A is —O—, —S—, —Se—, —N(R")— or Si(R') (R')—, and the like. Here, R' and R" are as described later.

As the polyarylene hole transporting polymer compound, preferable are those having "a repeating unit composed of an arylene group optionally having a substituent" of the following formula (6a):

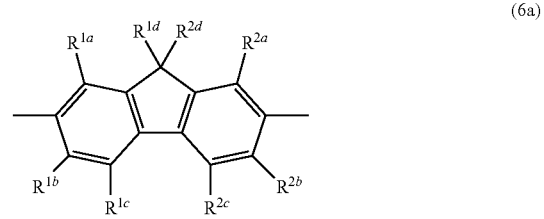

(6a)

(wherein, $R^{1a}$, $R^{1b}$, $R^{1c}$, $R^{1d}$, $R^{2a}$, $R^{2b}$, $R^{2c}$ and $R^{2d}$ represent each independently a hydrogen atom, alkyl group having 1 to 20 carbon atoms, alkoxy group having 1 to 20 carbon atoms, phenylalkyl group obtained by substituting an end hydrogen atom of the alkyl group with a phenyl group, phenylalkoxy group obtained by substituting an end hydrogen atom of the alkoxy group with a phenyl group, phenyl group, phenoxy group, alkylphenyl group obtained by substituting one or more hydrogen atoms on the benzene ring with an alkyl group having 1 to 20 carbon atoms, alkoxyphenyl group obtained by substituting one or more hydrogen atoms on the benzene ring with an alkoxy group having 1 to 20 carbon atoms, alkylcarbonyl group having 1 to 20 carbon atoms, alkoxycarbonyl group having 1 to 20 carbon atoms or carboxyl group having 1 to 20 carbon atoms. Here, $R^{1b}$ and $R^{1c}$, and $R^{2b}$ and $R^{2c}$ may together form a ring, respectively.) and/or "a repeating unit composed of a divalent heterocyclic group optionally having a substituent" of the following formula (6b):

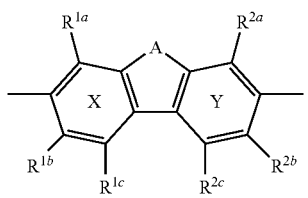

(6b)

(wherein, A represents an atom or atomic group forming a 5-membered ring or 6-membered ring together with two carbon atoms on the ring X and two carbon atoms on the ring Y, and $R^{1a}$, $R^{1b}$, $R^{1c}$, $R^{2a}$, $R^{2b}$ and $R^{2c}$ have the same meanings as described above. Here, $R^{1b}$ band $R^{1c}$, and $R^{2b}$ and $R^{2c}$ may together form a ring, respectively.), from the standpoint of hole mobility.

Examples of the alkyl group having 1 to 20 carbon atoms include linear alkyl groups such as a methyl group, ethyl group, n-propyl group and the like, branched alkyl groups having one or more branches in the chain such as an isopropyl group, tert-butyl group and the like, cycloalkyl groups in which carbon atoms constitute a 3- or more-membered saturated ring, and the like.

As the phenyl alkyl group, alkyl phenyl group and alkyl carbonyl group, for example, these groups in which alkyl portions are the same as described and exemplified in the above-described section of the alkyl group, and the like, are mentioned.

As the carboxyl group, for example, these groups in which alkyl portions are the same as described and exemplified in the above-described section of the alkyl group, and the like, are mentioned.

As the alkoxy group having 1 to 20 carbon atoms, for example, those in which groups described and exemplified in the above-described section of the alkyl group constitute groups via an oxygen atom, and the like, are mentioned.

As the phenyl alkoxy group, alkoxy phenyl group and alkoxy carbonyl group, these groups in which alkyl portions are the same as described and exemplified in the above-described section of the alkyl group, and the like, are mentioned.

Specific examples of the atom or atomic group represented by A in the above-described formula (6b) include, but not limited to, atoms, groups and the like of the following formulae.

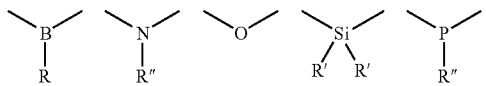

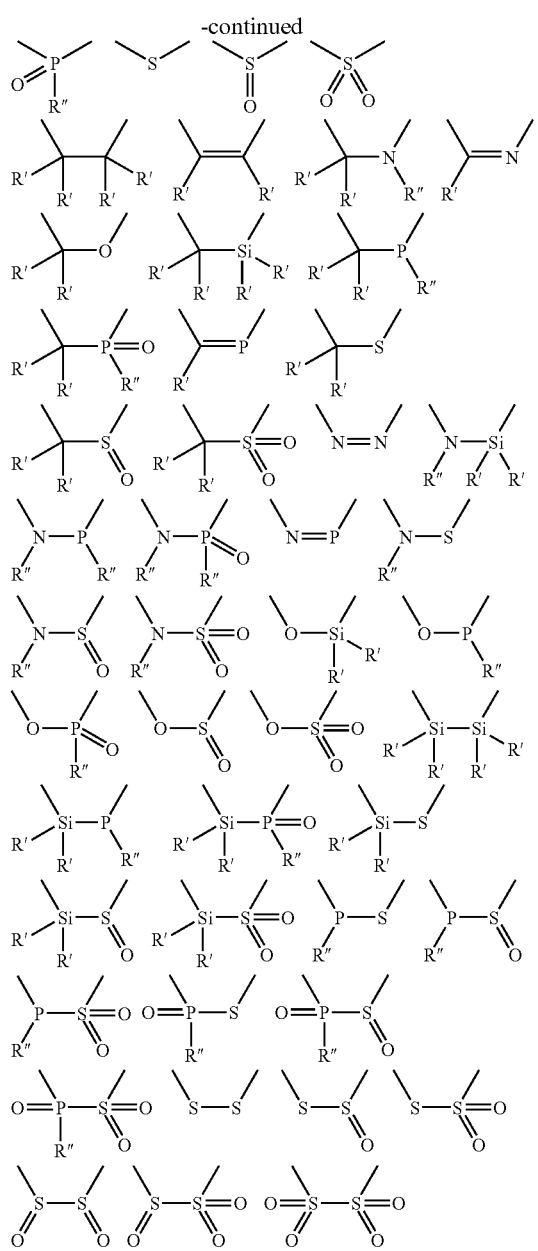

(wherein, R, R' and R" represent each independently a hydrogen atom, alkyl group having 1 to 20 carbon atoms, alkoxy group having 1 to 20 carbon atoms, phenylalkyl group obtained by substituting one or more end hydrogen atoms of the alkyl group with a phenyl group, phenylalkoxy group obtained by substituting one or more end hydrogen atoms of the alkoxy group with a phenyl group, phenyl group, phenoxy group, alkylphenyl group obtained by substituting one or more hydrogen atoms on the benzene ring with an alkyl group having 1 to 20 carbon atoms, alkoxyphenyl group obtained by substituting one or more hydrogen atoms on the benzene ring with an alkoxy group having 1 to 20 carbon atoms, alkylcarbonyl group having 1 to 20 carbon atoms, alkoxycarbonyl group having 1 to 20 carbon atoms or carboxyl group having 1 to 20 carbon atoms.).

The above-described R, R' and R" represent preferably a hydrogen atom, alkyl group having 1 to 20 carbon atoms, alkoxy group having 1 to 20 carbon atoms, or phenyl group obtained by substitution with one or more of alkyl group having 1 to 20 carbon atoms and/or alkoxy group having 1 to 20 carbon atoms from the standpoint of solubility of the hole transporting polymer material into a solvent and easiness of synthesis of raw material monomers of the "repeating unit composed of a divalent heterocyclic group optionally having a substituent". These R, R' and R" are specifically the same as described and exemplified specifically as the groups represented by $R^{1a}$, $R^{1b}$, $R^{1c}$, $R^{1d}$, $R^{2a}$, $R^{2b}$, $R^{2c}$ and $R^{2d}$ in the above-described formula (6a).

Examples of the repeating unit of the above-described formula (6a) or the above-described formula (6b) include the following structures.

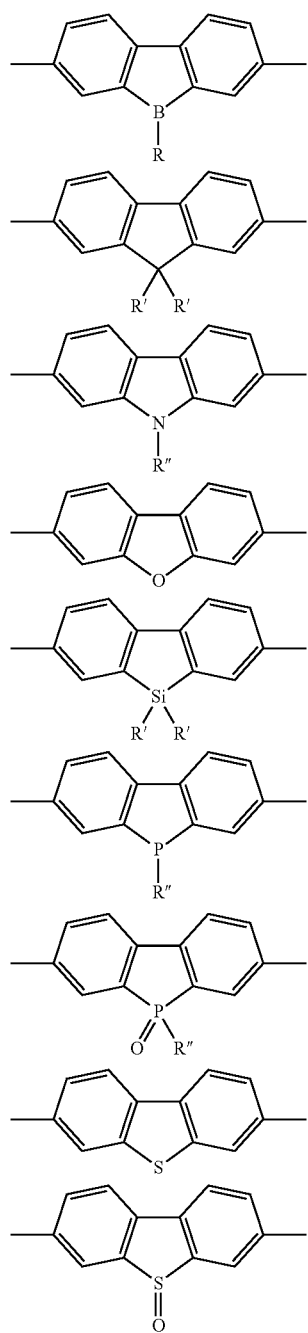
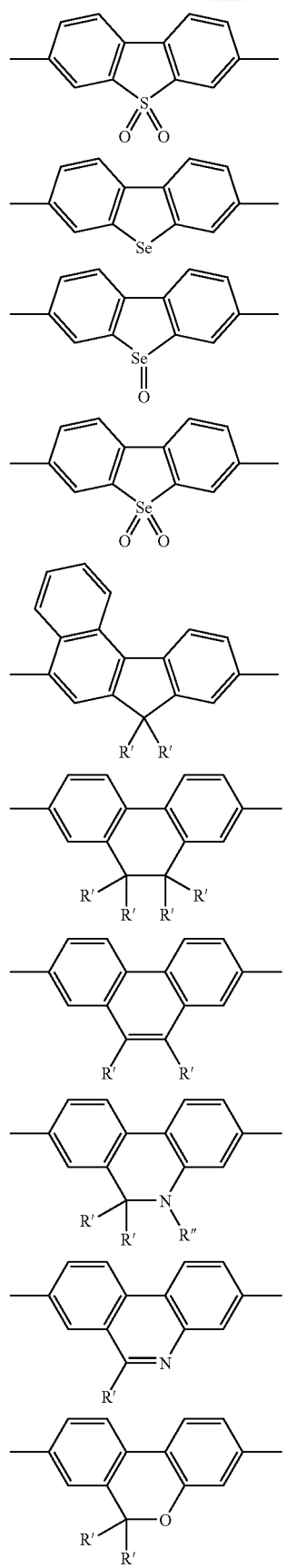

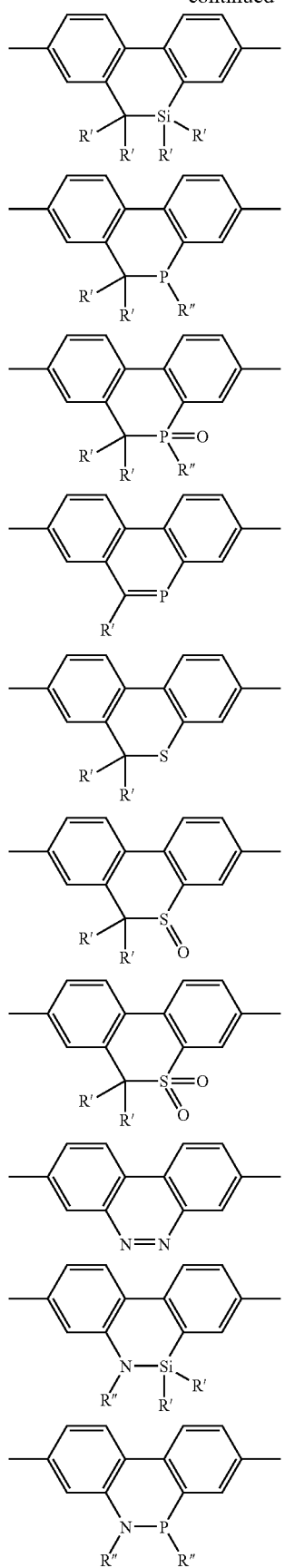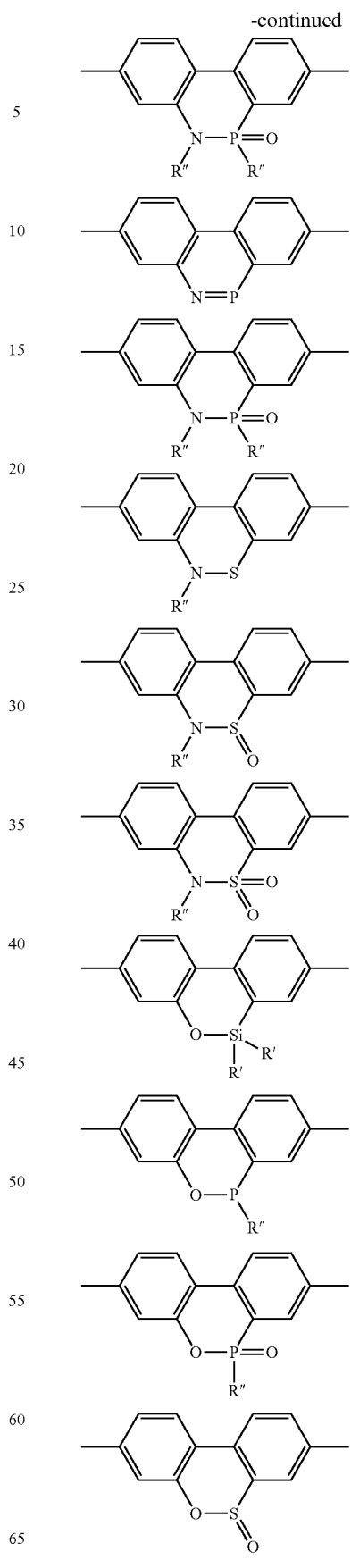

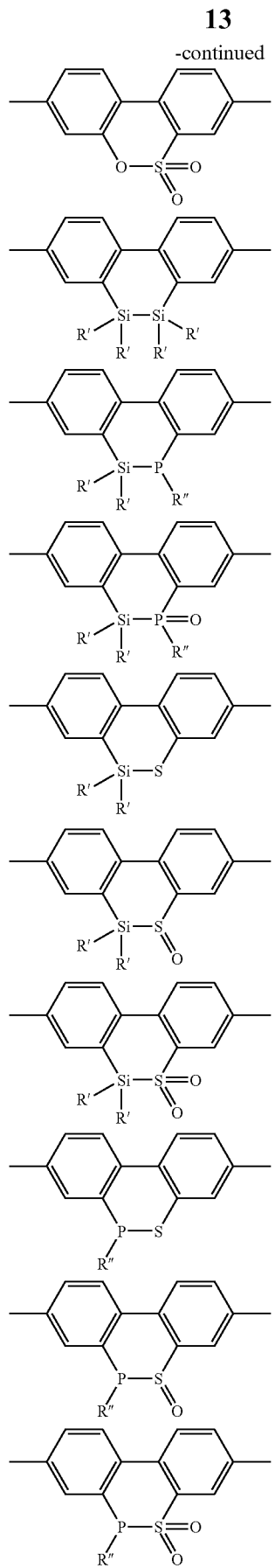
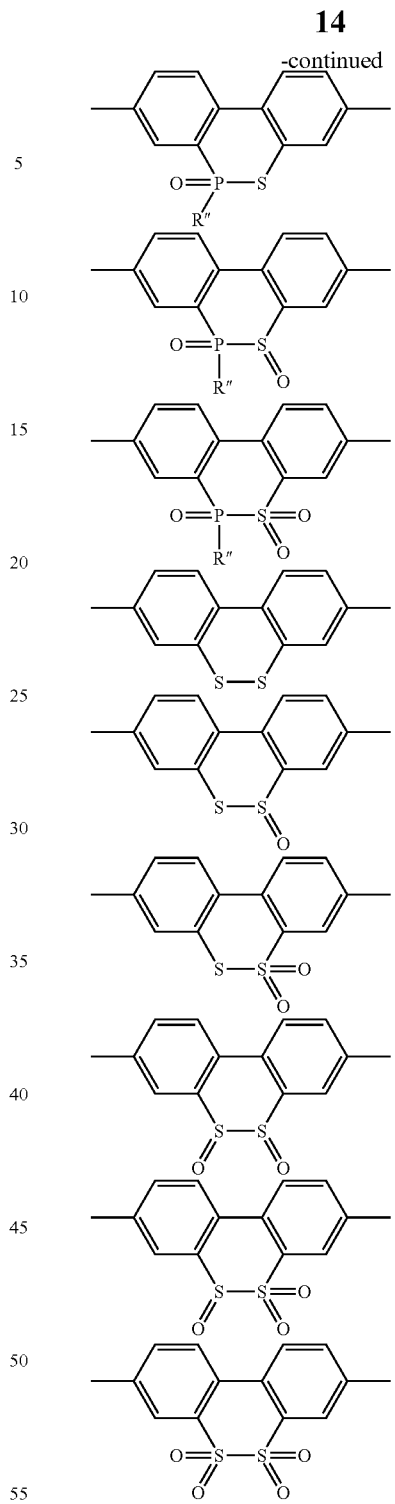

(wherein, R, R' and R" are as defined above. In the formulae, a hydrogen atom on the benzene ring may be substituted with an alkyl group having 1 to 20 carbon atoms, alkoxy group having 1 to 20 carbon atoms, phenylalkyl group obtained by substituting one or more end hydrogen atoms of the alkyl group with a phenyl group, phenylalkoxy group obtained by substituting one or more end hydrogen atoms of the alkoxy group with a phenyl group, phenyl group, phenoxy group, alkylphenyl group obtained by substituting one or more hydrogen atoms on the benzene ring with an alkyl group having 1 to 20 carbon atoms, alkoxyphenyl group obtained by substituting one or more hydrogen atoms on the benzene ring with an alkoxy group having 1 to 20 carbon atoms, alkylcarbonyl group having 1 to 20 carbon atoms, alkoxycarbonyl group having 1 to 20 carbon atoms or carboxyl group having 1 to 20 carbon atoms. When there exist two substituents at adjacent positions of the benzene ring, they may be mutually connected to form a ring.).

As the repeating unit of the above-described formula (6a), those of the following formula (A) are preferable from the standpoint of solubility of the hole transporting polymer material into a solvent, easiness of synthesis of raw material monomers of the "repeating unit composed of an arylene group optionally having a substituent", and hole transportability.

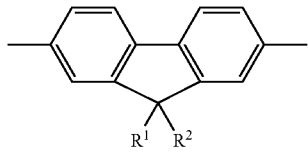

(A)

(wherein, $R^1$ and $R^2$ represent each independently a hydrogen atom, alkyl group having 1 to 20 carbon atoms, or phenyl group obtained by substituting one or more hydrogen atoms on the benzene ring with an alkyl group having 1 to 20 carbon atoms.).

These groups are specifically the same as described and exemplified specifically as the groups represented by $R^{1a}$, $R^{1b}$, $R^{1c}$, $R^{1d}$, $R^{2a}$, $R^{2b}$, $R^{2c}$ and $R^{2d}$ in the above-described formula (6a). $R^1$ and $R^2$ represents preferably an alkyl group having 1 to 20 carbon atoms.

It is preferable that the above-described hole transporting polymer compound has a repeating unit composed of a divalent residue of an aromatic amine compound optionally having a substituent, in addition to the repeating unit composed of an arylene group optionally having a substituent and/or repeating unit composed of a divalent heterocyclic group optionally having a substituent.

In this case, the proportion of the repeating unit composed of a divalent residue of an aromatic amine compound with respect to 1 mol of the sum of the repeating unit composed of an arylene group and the repeating unit composed of a divalent heterocyclic group is usually 0.1 to 10 mol.

As the repeating unit composed of a divalent residue of an aromatic amine compound, repeating units of the following formula (7) are preferable.

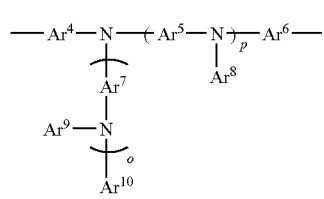

(7)

(wherein, $Ar^4$, $Ar^5$, $Ar^6$ and $Ar^7$ represent each independently an arylene group or divalent heterocyclic group. $Ar^8$, $Ar^9$ and $Ar^{10}$ represent each independently an aryl group or monovalent heterocyclic group. o and p represent each independently 0 or 1.).

In the above-described formula (7), the definitions and specific examples of the arylene group and divalent heterocyclic group are the same as described above. The aryl group has a carbon number of usually 6 to 60, and specifically, includes for example a phenyl group and the like. The monovalent heterocyclic group means an atomic group obtained by removing one hydrogen atom from a heterocyclic compound, and specifically, includes for example a pyridyl group and the like.

Specific examples of the repeating unit of the above-described formula (7) include repeating units of the following formulae.

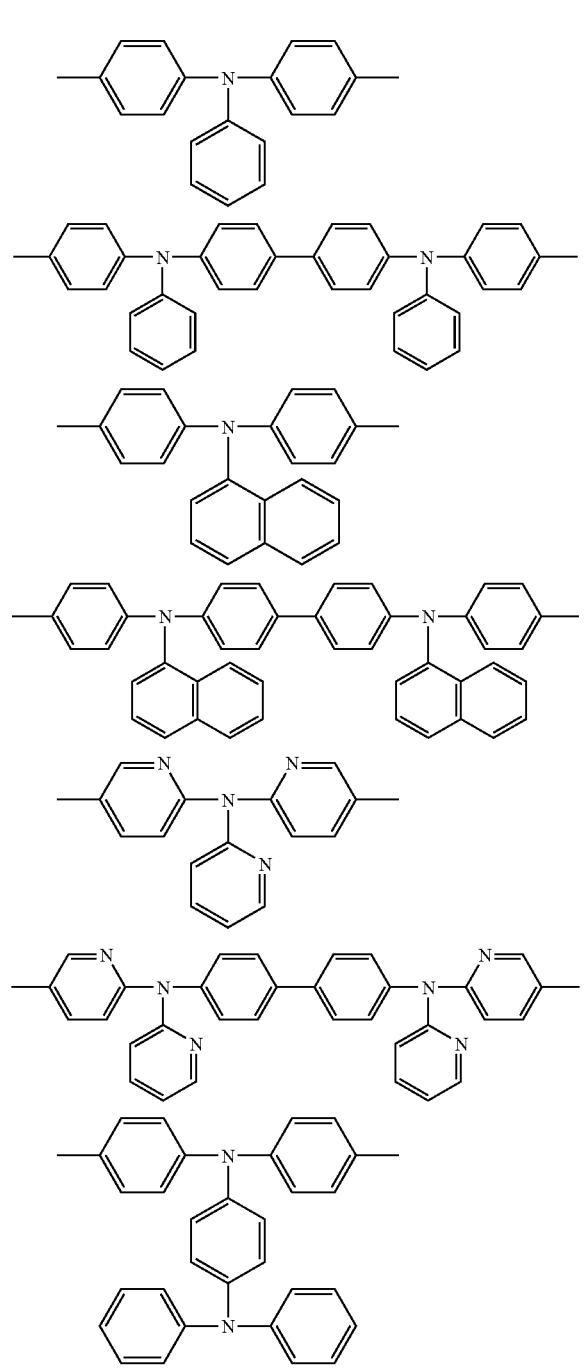

-continued

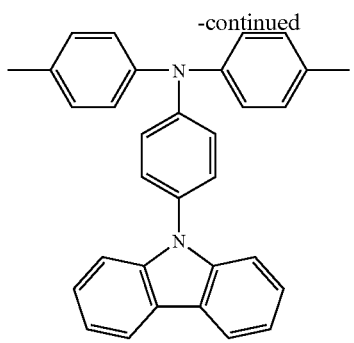

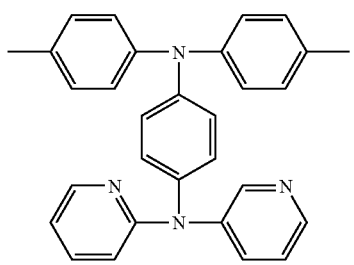

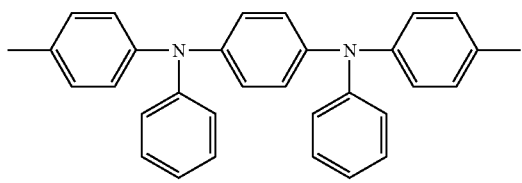

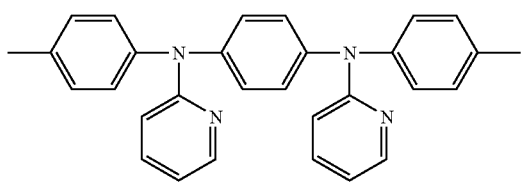

In the above-described formulae, a hydrogen atom on the aromatic ring may be substituted with an alkyl group having 1 to 20 carbon atoms, alkoxy group having 1 to 20 carbon atoms, phenylalkyl group obtained by substituting one or more end hydrogen atoms of the alkyl group with a phenyl group, phenylalkoxy group obtained by substituting one or more end hydrogen atoms of the alkoxy group with a phenyl group, phenyl group, phenoxy group, alkylphenyl group obtained by substituting one or more hydrogen atoms on the benzene ring with an alkyl group having 1 to 20 carbon atoms, alkoxyphenyl group obtained by substituting one or more hydrogen atoms on the benzene ring with an alkoxy group having 1 to 20 carbon atoms, alkylcarbonyl group having 1 to 20 carbon atoms, alkoxycarbonyl group having 1 to 20 carbon atoms or carboxyl group having 1 to 20 carbon atoms. These groups are specifically the same as described and exemplified specifically as the groups represented by $R^{1a}$, $R^{1b}$, $R^{1c}$, $R^{1d}$, $R^{2a}$, $R^{2b}$, $R^{2c}$ and $R^{2d}$ in the above-described formula (6a). When there exist two substituents at adjacent positions of the aromatic ring, they may be mutually connected to form a ring.).

Among repeating units of the above-described formula (7), preferable are repeating units of the following formula (8).

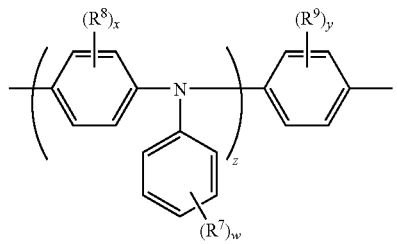

(8)

(wherein, $R^7$, $R^8$ and $R^9$ represent each independently an alkyl group having 1 to 20 carbon atoms, alkoxy group having 1 to 20 carbon atoms, phenylalkyl group obtained by substituting one or more end hydrogen atoms of the alkyl group with a phenyl group, phenylalkoxy group obtained by substituting one or more end hydrogen atoms of the alkoxy group with a phenyl group, phenyl group, phenoxy group, alkylphenyl group obtained by substituting one or more hydrogen atoms on the benzene ring with an alkyl group having 1 to 20 carbon atoms, alkoxyphenyl group obtained by substituting one or more hydrogen atoms on the benzene ring with an alkoxy group having 1 to 20 carbon atoms, alkylcarbonyl group having 1 to 20 carbon atoms, alkoxycarbonyl group having 1 to 20 carbon atoms or carboxyl group having 1 to 20 carbon atoms. x and y represent each independently an integer of 0 to 4, z represents 1 or 2, and w represents an integer of 0 to 5. When there exist a plurality of $R^7$s, $R^8$s and $R^9$s respectively, they may be the same or different. When there exist a plurality of $R^7$s, two $R^7$s may be mutually connected to form a ring.).

In the above-described formula (8), groups represented by $R^7$, $R^8$ and $R^9$ are specifically the same as described and exemplified specifically as the groups represented by $R^{1a}$, $R^{1b}$, $R^{1c}$, $R^{1d}$, $R^{2a}$, $R^{2b}$, $R^{2c}$ and $R^{2d}$ in the above-described formula (6a).

As the repeating unit of the above-described formula (8), those of the following formula (B) are preferable from the standpoint of solubility of the hole transporting polymer material into a solvent, easiness of synthesis of raw material monomers of the "repeating unit composed of a divalent residue of an aromatic amine compound optionally having a substituent", hole transportability and ionization potential.

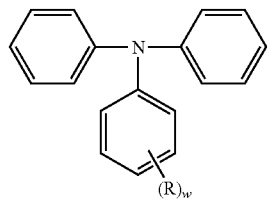

(B)

(wherein, R represents an alkyl group having 1 to 20 carbon atoms, and w represents an integer of 0 to 5. When there exist a plurality of Rs, they may be the same or different. When there exist a plurality of Rs, two Rs may be mutually connected to form a ring.).

The repeating unit of the above-described formulae (7), (8) and (B) may be contained singly or in combination.

In the above-described formula (B), the alkyl groups having 1 to 20 carbon atoms represented by R are the same as described and exemplified specifically as the groups represented by $R^{1a}$, $R^{1b}$, $R^{1c}$, $R^{1d}$, $R^{2a}$, $R^{2b}$, $R^{2c}$ and $R^{2d}$ in the above-described formula (6a).

Examples of the hole transporting polymer compound include, additionally, polyvinylcarbazole and derivatives thereof, polysiloxane derivatives having an aromatic amine on the side chain or main chain, pyrazoline derivatives, arylamine derivatives, stilbene derivatives, triphenyldiamine derivatives, polyaniline and derivatives thereof, polythiophene and derivatives thereof, and poly(p-phenylenevinylene) and derivatives thereof, and specific examples include those selected from compounds described in JP-A No. 63-70257, JP-A No. 63-175860, JP-A No. 2-135359, JP-A No. 2-135361, JP-A No. 2-209988, JP-A No. 3-37992 and JP-A No. 3-152184.

As the polysiloxane having an aromatic amine on the side chain or main chain and derivatives thereof, those having a hole transporting aromatic amine on the side chain or main chain are preferable.

In the organic electroluminescent device of the present invention, the thickness of the first organic layer shows an optimum value varying depending on the material to be used, and may be advantageously regulated so as to give suitable values of driving voltage and light emission efficiency, and is, for example, from 1 nm to 1 μm, preferably 2 nm to 500 nm, further preferably 5 nm to 200 nm.

In the organic electroluminescent device of the present invention, the electron transporting polymer compound to be contained in the second organic layer is not particularly restricted in its material providing it satisfies the above-described formulae (1) to (5), and usually, it has a function by which electrons are injected from a cathode or from another layer on the cathode side and transported, and π and σ conjugated polymers and polymers containing an electron transporting group in the molecule can be appropriately used. Specifically, use can be made of those described and exemplified in the section of the above-described hole transporting polymer compound, and polymer materials satisfying the above-described formulae (1) to (5) among those described in the literature describing the above-described hole transporting polymer compound. The electron transporting polymer compounds may be used singly or in combination of two or more.

Of them, electron transporting polymer compounds (hereinafter, referred to as "polyarylene electron transporting polymer compound") having a repeating unit composed of an arylene group optionally having a substituent, and/or a repeating unit composed of a divalent heterocyclic group optionally having a substituent are preferable. In the polyarylene electron transporting polymer compound, the total proportion of "repeating unit composed of an arylene group optionally having a substituent and repeating unit composed of a divalent heterocyclic group optionally having a substituent" occupying all repeating units is preferably from 20 to 100 mol %, further preferably 50 to 99 mol % from the standpoint of electron mobility. Here, the number of carbon atoms constituting a ring of the arylene group, specific examples of the arylene group, the number of carbon atoms constituting a ring of the divalent heterocyclic group, and specific examples of the divalent heterocyclic group are the same as described in the section of the above-described polyarylene hole transporting polymer compound.

As the polyarylene electron transporting polymer compound, preferable are those having "a repeating unit composed of an arylene group optionally having a substituent" of the above-described formula (6a), and/or "a repeating unit composed of a divalent heterocyclic group optionally having a substituent" of the above-described formula (6b), from the standpoint of electron mobility. The atoms and atomic groups represented by A in the above-described formula (6b) are the same as described and exemplified above, and the repeating units of the above-described formula (6a) or the above-described formula (6b) are the same as described and exemplified in the section of the above-described polyarylene hole transporting polymer compound.

The above-mentioned electron transporting polymer compound preferably has a repeating unit composed of a divalent residue of an aromatic amine compound optionally having a substituent, in addition to the repeating unit composed of an arylene group optionally having a substituent and/or the repeating unit composed of a divalent heterocyclic group optionally having a substituent, and more preferably has the repeating unit composed of an arylene group optionally having a substituent and repeating unit composed of a divalent residue of an aromatic amine compound optionally having a substituent. In this case, the molar ratio of the repeating unit composed of a divalent residue of an aromatic amine compound with respect to 1 mol of the sum of the repeating unit composed of an arylene group and the repeating unit composed of a divalent heterocyclic group is usually over 0 mol and less than 0.1 mol. As the repeating unit composed of an arylene group optionally having a substituent, repeating units of the above-described formula (A) are preferable.

As the repeating unit composed of a divalent residue of an aromatic amine compound, repeating units of the above-described formula (7) are preferable. The definitions and specific examples of the aryl group, arylene group, monovalent heterocyclic group and divalent heterocyclic group in the above-described formula (7) are the same as described above. Specific examples of the repeating unit of the above-described formula (7) are the same as described and exemplified in the section of the above-described polyarylene hole transporting polymer compound.

Of these repeating units composed of a divalent residue of an aromatic amine compound, those of the following formula (C) are preferable from the standpoint of solubility of the electron transporting polymer material into a solvent, easiness of synthesis of raw material monomers of the "repeating unit composed of a divalent residue of an aromatic amine compound optionally having a substituent", and light emission efficiency.

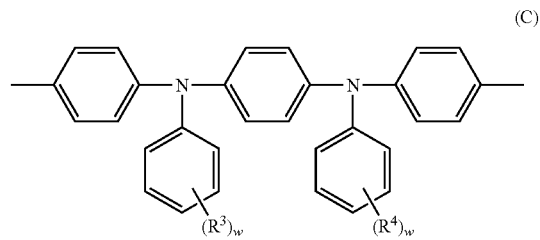

(C)

(wherein, $R^3$ and $R^4$ represent each independently an alkyl group having 1 to 20 carbon atoms, and w represents an integer of 0 to 5. A plurality of ws may be the same or different. When there exist a plurality of $R^3$s and $R^4$s, they may be the same or different.).

In the above-described formula (C), the alkyl groups having 1 to 20 carbon atoms represented by $R^3$ and $R^4$ are the same as described and exemplified specifically as the groups represented by $R^{1a}$, $R^{1b}$, $R^{1c}$, $R^{1d}$, $R^{2a}$, $R^{2b}$, $R^{2c}$ and $R^{2d}$ in the above-described formula (6a). Preferably, w represent 0 or 1, and $R^3$ and $R^4$ represent an alkyl group having 1 to 6 carbon atoms.

In the organic electroluminescent device of the present invention, the thickness of the second organic layer shows an optimum value varying depending on the material to be used, and may be advantageously regulated so as to give suitable values of driving voltage and light emission efficiency, and is, for example, from 1 nm to 1 μm, preferably 2 nm to 500 nm, further preferably 5 nm to 200 nm.

The hole transporting polymer compound and the electron transporting polymer compound to be used in the present invention may be any of an alternative copolymer, random polymer, block polymer or graft copolymer, or a polymer having an intermediate structure thereof, for example, a random copolymer having a block property. A random copolymer having a block property and a block copolymer or graft copolymer are more preferable than a complete random copolymer, since a high electric charge transporting performance is manifested, resultantly, higher efficiency, lower driving voltage and longer life can be attained. Polymers having branching in the main chain and thus having 3 or more end parts, and so-called dendrimers are also included.

An end portion of the above-described hole transporting polymer compound and the above-described electron transporting polymer compound is preferably protected by a stable group since if a polymerization active group remains intact, there is a possibility of decrease in light emitting property and life of the resultant device when used in manufacturing of the device. A structure having a conjugation bond continuous with a conjugation structure of the main chain is preferable as the end group, and for example, a structure bonding to an aryl group or heterocyclic group via a carbon-carbon bond is mentioned. Specific examples include substituents described in chemical formula 10 in Japanese Patent Application Laid-Open (JP-A) No. 9-45478, and the like.

The above-described hole transporting polymer compound and the above-described electron transporting polymer compound have a polystyrene-reduced number average molecular weight of preferably about from $10^3$ to $10^8$, more preferably about from $10^4$ to $10^6$.

As the synthesis method of the above-described hole transporting polymer compound and the above-described electron transporting polymer compound, for example, a method of polymerization by the Suzuki coupling reaction from monomers corresponding to the desired polymer, a method of polymerization by the Grignard reaction, a method of polymerization by a Ni(0) catalyst, a method of polymerization by an oxidizer such as $FeCl_3$ and the like, a method of electrochemical oxidation polymerization, a method by decomposition of an intermediate polymer having a suitable leaving group, and the like, are mentioned. Of them, the method of polymerization by the Suzuki coupling reaction, the method of polymerization by the Grignard reaction, and the method of polymerization by a Ni(0) catalyst are preferable since control of the reaction is easier.

Since the purity of the above-described hole transporting polymer compound and the above-described electron transporting polymer compound exerts an influence on the light emitting property of a device, it is preferable that a monomer before polymerization is purified by a method such as distillation, sublimation purification, re-crystallization and the like before performing polymerization thereof, further, it is preferable that, after synthesis, re-precipitation purification is carried out, and a purification treatment such as fractionation by chromatography, or the like is carried out.

As the above-described hole transporting polymer compound and the above-described electron transporting polymer compound, those having a light emitting function in addition to the electric charge transporting function can also be suitably used, and in the present invention, a light emitting material is mixed with any one of or both of these polymer compounds.

In the organic electroluminescent device of the present invention, fluorescent materials or triplet light emitting materials described in "Organic EL Display" (collectively written by Shizuo Tokito, Chihaya Adachi and Hideyuki Murata, Ohmsha Ltd., 2004, first edition, first printing) p. 17 to 48, p. 83 to 99, 101 to 120 can be used as the light emitting material to be contained in the first organic layer and/or the second organic layer. As the fluorescent material of low molecular weight, for example, naphthalene derivatives, anthracene and derivatives thereof, perylene and derivatives thereof, polymethine coloring matters, xanthene coloring matters, coumarin coloring matters, cyanine coloring matters and the like, metal complexes of 8-hydroxyquinoline, metal complexes of 8-hydroxyquinoline derivative, aromatic amines, tetraphenylcyclopentadiene and derivatives thereof, tetraphenylbutadiene and derivatives thereof, and the like, can be used. Specific examples of the above-described light emitting material include copolymers composed of a repeating unit of the following formula, those described in JP-A No. 57-51781 and JP-A No. 59-194393, and the like.

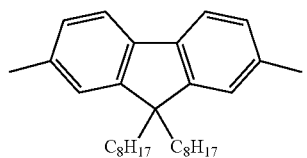

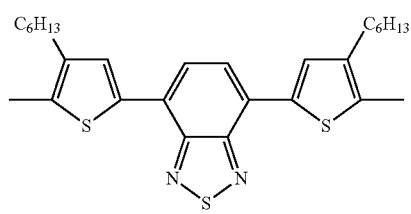

As the triplet light emitting complex as the triplet light emitting material, for example, $Ir(ppy)_3$, $Btp_2Ir(acac)$ containing iridium as a central metal, PtOEP containing platinum as a central metal, $Eu(TTA)_3phen$ containing europium as a central metal, and the like are mentioned.

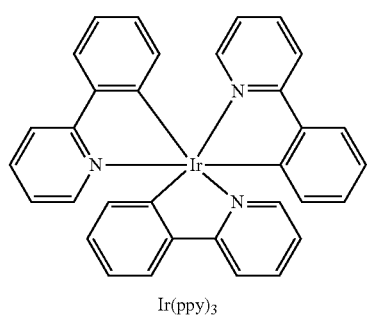

$Ir(ppy)_3$

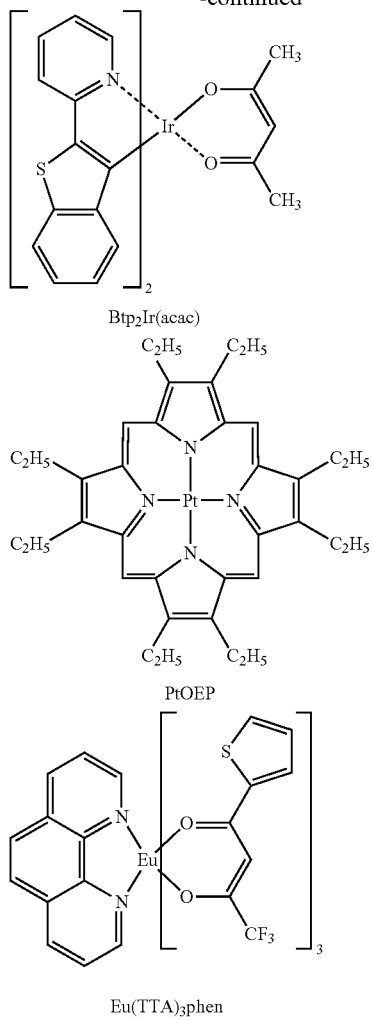

Btp₂Ir(acac)

PtOEP

Eu(TTA)₃phen

Specific examples of the triplet light emitting complex are described in Nature, (1998), 395, 151, Appl. Phys. Lett. (1999), 75(1), 4, Proc. SPIE-Int. Soc. Opt. Eng. (2001), 4105 (organic Light-Emitting Materials and Devices IV), 119, J. Am. Chem. Soc., (2001), 123, 4304, Appl. Phys. Lett., (1997), 71(18), 2596, Syn. Met., (1998), 94(1), 103, Syn. Met., (1999), 99(2), 1361, Adv. Mater., (1999), 11(10), 852, Jpn. J. Appl. Phys., 34, 1883 (1995), and the like.

Together with the above-described fluorescent materials and triplet light emitting materials, also polymer light emitting materials containing in the molecular structure a structure of these materials or polymer light emitting materials showing themselves specific light emission are mixed with a hole transporting polymer compound and/or an electron transporting polymer compound (hereinafter, the above-described fluorescent material, the above-described triplet light emitting material and the above-described polymer light emitting material are collectively called "light emitting material").

In the electroluminescent device of the present invention, the proportion of the light emitting material to be mixed with a hole transporting polymer compound contained in the first organic layer and/or an electron transporting polymer compound contained in the second organic layer is from 0.01 wt % to 50 wt %, preferably 0.05 wt % to 10 wt % with respect to the sum of all components contained in the organic layers.

The electroluminescent device of the present invention emits light in a color range in which values of x and y on the CIE chromatic coordinate satisfy the above-described formula (P) or the above-described formula (Q). Such emission color is obtained by a fact that light emission spectrum emitted from a device is single, or a fact that in the case two or more light emission spectra, one light emission spectrum of strong intensity and another light emission spectrum of weak intensity are combined, or mutually analogous light emission spectra are combined. "light emission spectrum is single" means that only one compound or material emits light.

For example, for obtaining blue light emission in the organic electroluminescent device of the present invention in which the value of x is from 0.1 to 0.2 and the value of y is from 0.1 to 0.3 on the CIE chromatic coordinate, it may be advantageous that all of the hole transporting polymer compound contained in the first organic layer, the electron transporting polymer compound contained in the second organic layer, and the light emitting materials contained in the first and/or second organic layer are selected from those emitting light with spectrum showing a peak in about from 400 nm to 530 nm in terms of emission wavelength.

More specifically, blue light emission is obtained when a copolymer having equimolar amounts of a repeating unit of the above-described formula (A) and a repeating unit of the above-described formula (B) is used as the hole transporting polymer compound, a polymer composed only of a repeating unit of the above-described (A) is used as the electron transporting polymer compound, and a copolymer having 90 mol % of a repeating unit of the above-described (A) and 10 mol % of a repeating unit of the above-described formula (C) is used as the light emitting material, and they are mixed in an amount of 5 wt % into the first organic layer.

In contrast, red light emission is obtained when the light emitting material is selected from materials showing red fluorescent spectrum and the light emitting material is mixed in an amount of 50 wt % into the first organic layer, though the hole transporting polymer compound and electron transporting polymer compound are the same as described above.

The organic electroluminescent device of the present invention may be produced by any methods, and for example, can be produced by the following method.

In the organic electroluminescent device of the present invention, methods of film formation from solution are used for production of the first organic layer and the second organic layer. For film formation from solution, for example, application methods such as a spin coat method, casting method, micro gravure coat method, gravure coat method, bar coat method, roll coat method, wire bar coat method, dip coat method, spray coat method, screen printing method, flexo printing method, offset printing method, inkjet printing method and the like can be used. Of them, printing method such as a screen printing method, flexo printing method, offset printing method, inkjet printing method and the like are preferable since pattern formation and multicolor divisional painting are possible.

In the above-described film formation from solution, usually, an ink is used. This ink contains the above-described hole transporting polymer compound or the above-described electron transporting polymer compound, and a solvent. Though this solvent is not particularly restricted, preferable are those capable of dissolving or uniformly dispersing components other than the solvent constituting the ink, namely, the hole transporting polymer compound, electron transporting polymer compound, light emitting material and the like. Examples of the above-described solvent include chlorine-based solvents such as chloroform, methylene chloride, 1,2- dichloroethane, 1,1,2-trichloroethane, chlorobenzene, o-dichlorobenzene and the like, ether solvents such as tetrahydrofuran, dioxane and the like, aromatic hydrocarbon solvents such as toluene, xylene and the like, aliphatic hydrocarbon solvents such as cyclohexane, methylcyclohexane, n-pentane, n-hexane, n-heptane, n-octane, n-nonane, n-decane and the like, ketone solvents such as acetone, methyl ethyl ketone, cyclohexanone and the like, ester solvents such as ethyl acetate, butyl acetate, ethylcellosolve acetate and the like, polyhydric alcohols such as ethylene glycol, ethylene glycol monobutyl ether, ethylene glycol monoethyl ether, ethylene glycol monomethyl ether, dimethoxyethane, propylene glycol, diethoxymethane, triethylene glycol monoethyl ether, glycerin, 1,2-hexanediol and the like and derivatives thereof, alcohol solvents such as methanol, ethanol, propanol, isopropanol, cyclohexanol and the like, sulfoxide solvents such as dimethyl sulfoxide and the like, amide solvents such as N-methyl-2-pyrrolidone, N,N-dimethylformamide and the like. The above-described solvents may be used singly or in combination of two or more.

Of them, aromatic hydrocarbon solvents, aliphatic hydrocarbon solvents, ester solvents and ketone solvents are preferable from the standpoint of solubility of the hole transporting polymer compound, electron transporting polymer compound, light emitting material and the like, uniformity in film formation, viscosity property, and the like, and preferable are toluene, xylene, ethylbenzene, diethylbenzene, trimethylbenzene, n-propylbenzene, i-propylbenzene, n-butylbenzene, i-butylbenzene, s-butylbenzene, anisole, ethoxybenzene, 1-methylnaphthalene, cyclohexane, cyclohexanone, cyclohexylbenzene, bicyclohexyl, cyclohexenylcyclohexanone, n-heptylcyclohexane, n-hexylcyclohexane, 2-propylcyclohexanone, 2-heptanone, 3-heptanone, 4-heptanone, 2-octanone, 2-nonanone, 2-decanone and dicyclohexyl ketone, and it is more preferable to contain at least one of xylene, anisole, cyclohexylbenzene and bicyclohexyl.

The proportion of the solvent in the inks is from 1 wt % to 99.9 wt %, preferably 60 wt % to 99.5 wt %, further preferably 80 wt % to 99.0 wt % with respect to solutes (namely, total weight of hole transporting polymer compound, electron transporting polymer compound, and light emitting material).

Though the viscosity of the ink varies depending on the printing method, the viscosity at 25° C. is preferably in a range of from 1 to 20 mPa·s for preventing clogging and flying curving in discharging when the ink passes through a discharge apparatus such as in an inkjet print method and the like.

In laminating the first organic layer and the second organic layer, it is preferable to insolubilize the first organic layer for preventing mixing of both layers. For example, the above-described first organic layer can be insolubilized before providing a second organic layer in contact with the insolubilized first organic layer. Examples of the treatment for insolubilizing the above-described first organic layer include methods in which a soluble precursor or a polymer having a soluble substituent is used, the precursor is converted into a conjugated polymer by thermal treatment, or the substituent is decomposed to lower solubility, thereby attaining insolubilization, methods in which a hole transporting polymer having a crosslinking group in the molecule is used, methods in which monomers or macromers generating a crosslinking reaction by heat, light, electron beam and the like are mixed, and other methods.

Examples of the above-described hole transporting polymer compound having a crosslinking group in the molecule include the above-described hole transporting polymer compounds having a crosslinking group on the side chain. Examples of such a crosslinking group include a vinyl group, acetylene group, butenyl group, acrylic group, acrylate group, acrylamide group, methacryl group, methacrylate group, methacrylamide group, vinyl ether group, vinylamino group, silanol group, groups having a small ring (for example, cyclopropyl group, cyclobutyl group, epoxy group, oxetane group, diketene group, episulfide group and the like), lactone group, lactam group, groups containing a siloxane derivative, and the like. In addition to these groups, combinations of groups capable of forming an ester bond or amide bond can also be used. For example, combinations of an ester group and amino group, an ester group and hydroxyl group, and the like are mentioned. Of them, monomers having an acrylate group or methacrylate group are particularly preferable.

Specific examples of mono-functional monomers having an acrylate group or methacrylate group include 2-ethylhexylcarbitol acrylate, 2-hydroxyethyl acrylate and the like. Specific examples of bi-functional monomers having an acrylate group or methacrylate group include 1,6-hexanediol diacrylate, 1,6-hexanediol dimethacrylate, ethylene glycol diacrylate, ethylene glycol dimethacrylate, neopentyl glycol diacrylate, neopentyl glycol dimethacrylate, triethylene glycol diacrylate, triethylene glycol dimethacrylate, 3-methylpentanediol diacrylate, 3-methylpentanediol dimethacrylate and the like. Specific examples of other poly-functional monomers having an acrylate group or methacrylate group include trimethylolpropane triacrylate, trimethylolpropane trimethacrylate, pentaerythritol triacrylate, pentaerythritol trimethacrylate, pentaerythritol tetraacrylate, pentaerythritol tetramethacrylate, dipentaerythritol pentaacrylate, dipentaerythritol pentamethacrylate, dipentaerythritol hexaacrylate, dipentaerythritol hexamethacrylate and the like.

The content ratio of the crosslinking group in the hole transporting polymer compound containing in its molecule the above-described crosslinking group is usually from 0.01 to 30 wt %, preferably 0.5 to 20 wt %, more preferably 1 to 10 wt %.

Examples of the monomer and macromer generating a crosslinking reaction include those having a polystyrene-reduced weight average molecular weight of 2000 or less and having two or more of the above-described crosslinking groups.

Examples of the crosslinking reaction of the polymer having a crosslinking, group and the monomer or macromer generating a crosslinking reaction reactions occurring by heating, irradiation with light, electron beam and the like. The above-described reaction may be carried out in the presence of a thermal polymerization initiator, photopolymerization initiator, thermal polymerization initiation aid, photopolymerization initiation aid and the like.

In the case of insolubilization by heating, the temperature is not particularly restricted providing it is not higher than the temperature at which the material is decomposed to lower its property, and for example, from 50° C. to 300° C., preferably 100° C. to 250° C.

In the case of insolubilization by heating, as the thermal polymerization initiator which can be used together, use can be made of those generally known as a radical polymerization initiator, and for example, azo compounds such as 2,2'-azobisisobutyronitrile, 2,2'-azobis-(2,4-dimethylvaleronitrile), 2,2'-azobis(4-methoxy-2,4-dimethylvaleronitrile) and the like; organic peroxides such as benzoyl peroxide, lauroyl peroxide, t-butyl peroxy pivalate, 1,1'-bis(t-butyl peroxy)cyclohexanone and the like; and hydrogen peroxide are mentioned. In the case of use of a peroxide as the radical polymerization initiator, the peroxide may be used together with a reducing agent to give a redox type initiator. These thermal polymerization initiators can be used singly or in combination of two or more.

The reaction temperature in the case of simultaneous use a thermal polymerization initiator is, for example, from 40° C. to 250° C., preferably 50° C. to 200° C.

In photopolymerization using a photopolymerization initiator, irradiation with ultraviolet ray may be performed at an irradiation intensity of 0.01 mW/cm² or more for from 1 to 3600 seconds, preferably 30 to 600 seconds.

The photopolymerization initiator includes active radical generators generating an active radical by irradiation with light, acid generators generating an acid by irradiation with light, and the like. Examples of the active radical generator include acetophenone photopolymerization initiators, benzoin photopolymerization initiators, benzophenone photopolymerization initiators, thioxanthone photopolymerization initiators, triazine photopolymerization initiators, and the like. These photopolymerization initiators can be used singly or in combination of two or more.

The organic electroluminescent device of the present invention can be used as a display such as a sheet light source, segment display, dot matrix display, liquid crystal display and the like, or backlight or the like of the display.

Examples will be shown below for illustrating the present invention further in detail, but the present invention is not limited the them.

The polystyrene-reduced number average molecular weight is measured by gel permeation chromatography (GPC). In GPC measurement, two TSKgel Super HM-H (trade name) manufactured by Tosoh Corp. and one TSKgel Super H2000 (trade name)(4.6 mm, I.d.×15 cm) manufactured by Tosoh Corp. are used as the column, and for detection of polymer elution time, a differential refractive index detector (manufactured by Shimadzu Corp., trade name: SHIMADZU RID-10A) is used, and tetrahydrofuran (THF) is used as a mobile phase.

The ionization potential and electron affinity of a hole transporting polymer compound, electron transporting polymer compound and light emitting material are measured by a cyclic voltammetry method. The conditions thereof are as described below.

A function generator and a potentiostat are used. A grass carbon electrode is used as an active electrode, and a sample is cast to form a thin film thereon. Platinum is used as a counter electrode, and Ag/Ag⁺ is used as a reference electrode, and measurement of potential is carried out in an acetonitrile solution of 0.1M tetrafluoroboric acid tetra-n-butyl ammonium [$CH_3(CH_2)_3$]$_4$N.BF$_4$. The scanning range is 0 to 1500 mV for the oxidation side and −2900 mV to 0 mV for the reduction side. The oxidation potential and reduction potential are read from a displacement point of curve of the potential wave. The ionization potential (Ip) and electron affinity (Ea) are calculated from the value of oxidation potential and the value of reduction potential according to the following formulae (8), (9).

$$Ip=[(\text{oxidation potential})+0.45+4.5] \text{ eV} \quad (8)$$

$$Ea=[(\text{reduction potential})+0.45+4.5] \text{ eV} \quad (9)$$

As the anode, ITO (indium-tin oxide) is used. The value of the work function thereof is measured at a point of initiation of photoelectron emission by ultraviolet ray excitation using a photoelectron spectrometer (manufactured by RIKEN KEIKI Co., Ltd., trade name: AC-2).

As the cathode, barium which is a metal of low work function is used. The value of the work function thereof was determined to 2.70 eV (a value measured by a thermal electron discharge method) according to descriptions of a literature (J. H. Michaelson et al., Journal of Applied Phisics Vol. 48, No. 11, P. 4729 (1977)).

Synthesis Example 1

Synthesis of Hole Transporting Polymer Compound

Into a 200 mL three-necked round-bottomed flask connected to a Dimroth condenser was added 1.59 g (3.00 mmol) of a compound A of the following formula:

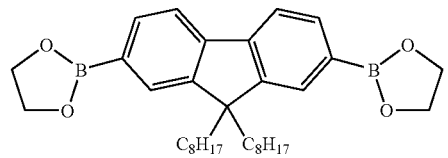

1.17 g (2.55 mmol) of a compound B of the following formula:

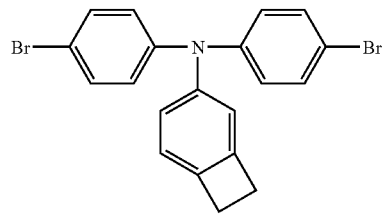 [SMILES: Brc1ccc(N(c2ccc(Br)cc2)c2ccc3c(c2)CC3)cc1]

0.19 g (0.45 mmol) of a compound C of the following formula:

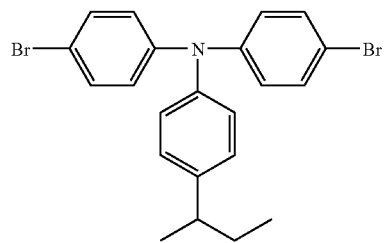 [SMILES: CCC(C)c1ccc(N(c2ccc(Br)cc2)c2ccc(Br)cc2)cc1]

and 23 mL of toluene, to prepare a monomer solution. Under a nitrogen atmosphere, this monomer solution was heated, and into this, 1.2 mg of palladium acetate, 9.5 mg of tris(2-methoxyphenyl)phosphine and 10.2 g of a 20 wt % tetraethyl ammonium hydroxide aqueous solution were poured at 50° C. Subsequently, the resultant solution was heated at 105° C., then, stirred for 4 hours. To this was added 366 mg of phenylboric acid dissolved in 1.5 mL of toluene, and the mixture was stirred at 105° C. for 2 hours To the resultant solution was added 0.6 g of sodium N,N-diethyldithiocarbamate trihydrate and 9 mL of ion exchange water, and the mixture was stirred at 65° C. for 2 hours. The organic layer of thus obtained solution was separated from the aqueous layer, then, the organic layer was washed with about 70 mL of 2 M hydrochloric acid (once), about 70 mL of a 10 wt % sodium acetate aqueous solution (once) and about 70 mL of ion exchange water (three times), in this order. The organic layer was dropped into about 800 mL of methanol to cause precipitation of the polymer, and the precipitate was filtrated, then, dried to obtain a solid. This solid was dissolved in about 90 mL of toluene to give a coarse product solution, and the coarse product solution was allowed to pass through a silica gel/alumina column through which toluene had been passed previously, and this coarse product solution was dropped into about 800 mL of methanol to cause precipitation of the polymer, and the precipitate was filtrated, then, dried to obtain a hole transporting polymer compound (ionization potential: 5.46 eV).

Thus obtained hole transporting polymer compound had a polystyrene-reduced number average molecular weight of $9.3 \times 10^4$ and a polystyrene-reduced weight average molecular weight of $3.2 \times 10^5$. The hole transporting polymer compound is estimated from the charge materials to contain repeating units of the following structural formulae at 50:42.5:7.5 (molar ratio).

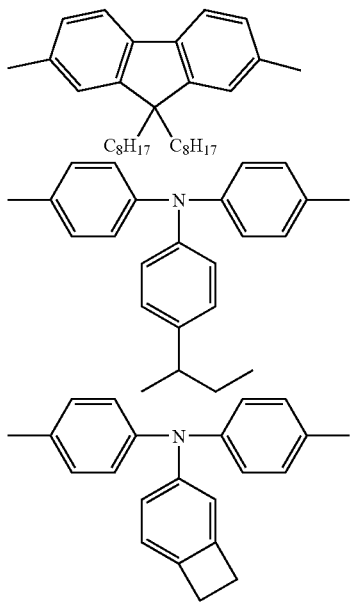

Synthesis Example 2

Synthesis of Light Emitting Material

Into a 200 mL separable flask connected to a Dimroth condenser was added 0.76 g (1.4 mmol) of the above-described compound A, 0.94 g (1.5 mmol) of a compound D of the following formula:

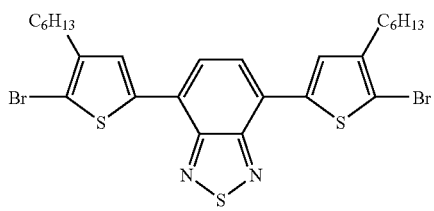

0.23 g of methyl trioctyl ammonium chloride (trade name: Aliquat 336, manufactured by Aldrich) and 20 mL of toluene, to prepare a monomer solution. Under a nitrogen atmosphere, this monomer solution was heated, and into this, 0.8 mg of palladium acetate and 4.5 mg of tris(2-methoxyphenyl)phosphine were poured at 50° C., and the mixture was heated at 85° C. Then, the resultant solution was heated up to 105° C. while dropping 8.4 g of a 2 M sodium carbonate aqueous solution, then, the mixture was stirred for 1 hour. To the resultant solution was added 134 mg of t-butylphenylboric acid dissolved in 0.8 mL of toluene, and the mixture was stirred at 105° C. for 2 hours To the resultant solution was added 0.3 g of sodium N,N-diethylthiocarbamate trihydrate and 5 mL of ion exchange water, and the mixture was stirred at 65° C. for 2 hours. The organic layer of thus obtained solution was separated from the aqueous layer, then, the organic layer was washed with about 20 mL of ion exchange water three times. The organic layer after washing was dropped into about 230 mL of methanol to cause precipitation of the polymer, and the precipitate was filtrated, then, dried to obtain a solid. This solid was dissolved in about 50 mL of toluene to give a coarse product solution, and the coarse product solution was allowed to pass through a silica gel/alumina column through which toluene had been passed previously, and this coarse product solution was dropped into about 230 mL of methanol to cause precipitation of the polymer, and the precipitate was filtrated, then, dried to obtain a polymer (light emitting material)(ionization potential: 5.52 eV, electron affinity: 3.29 eV).

Thus obtained polymer (light emitting material) had a polystyrene-reduced number average molecular weight of $2.0 \times 10^4$ and a polystyrene-reduced weight average molecular weight of $3.9 \times 10^4$. This polymer (light emitting material) is estimated from the charge materials to contain repeating units of the following formulae at 1:1 (molar ratio).

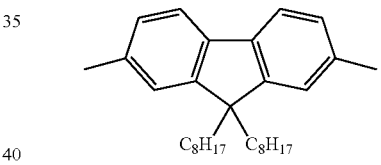

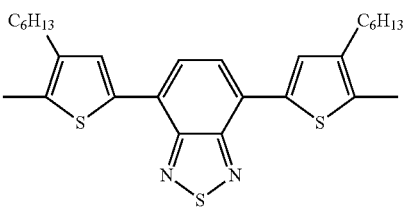

Synthesis Example 3

Synthesis of Electron Transporting Polymer Compound

Into a 150 mL cylindrical flask connected to a Dimroth condenser was added 2.65 g (5.0 mmol) of the above-described compound A, 2.58 g (4.7 mmol) of a compound E of the following formula:

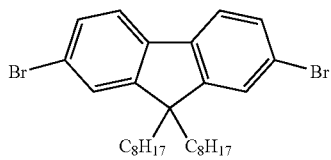

0.21 g (0.3 mmol) of a compound F of the following formula:

0.65 g of methyl trioctyl ammonium chloride (trade name: Aliquat 336, manufactured by Aldrich) and 50 mL of toluene, to prepare a monomer solution. Under a nitrogen atmosphere, this monomer solution was heated, and into this, 1.1 mg of palladium acetate and 12.3 mg of tris(2-methoxyphenyl)phosphine were added to obtain a solution which was then stirred at 95° C. for 5 hours while dropping 9.7 g of a 17.5 wt % sodium carbonate aqueous solution. To the resultant solution was added 0.09 g of phenylboric acid, and the mixture was stirred at 95° C. for 3 hours. To this was added 60 g of toluene, and the resultant solution was stirred at 75° C. for 3 hours. To the resultant solution was added 0.3 g of sodium N,N-diethylthiocarbamate trihydrate and 30 g of ion exchange water, and the resultant solution was stirred at 75° C. for 3 hours. The organic layer of thus obtained solution was separated from the aqueous layer, then, the organic layer was washed with about 40 mL of ion exchange water (once), about 50 mL of a 10 wt % acetic acid aqueous solution (once) and about 50 mL of ion exchange water (twice), in this order. The organic layer after washing was dropped into about 1 L of methanol to cause precipitation of the polymer, and the precipitate was filtrated, then, dried to obtain a solid. This solid was dissolved in about 500 mL of toluene to give a coarse product solution, and the coarse product solution was allowed to pass through an alumina column through which toluene had been passed previously, and this coarse product solution was dropped into about 1.5 L of methanol to cause precipitation of the polymer, and the precipitate was filtrated, then, dried to obtain an electron transporting polymer compound (ionization potential: 5.91 eV, electron affinity: 2.35 eV).

Thus obtained electron transporting polymer compound had a polystyrene-reduced number average molecular weight of $2.3 \times 10^5$ and a polystyrene-reduced weight average molecular weight of $5.0 \times 10^5$. This electron transporting polymer compound is estimated from the charge materials to contain repeating units of the following formulae at 1:0.03 (molar ratio).

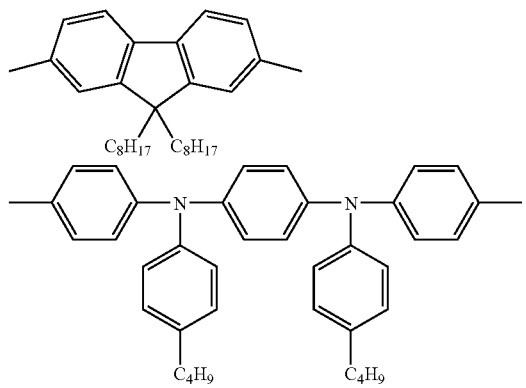

Synthesis Example 4

Preparation of Mixed Solution of Hole Transporting Polymer Compound/Light Emitting Material A hole transporting polymer compound and light emitting material of the same weight were dissolved in xylene, to prepare a mixed solution of hole transporting polymer compound/light emitting material (concentration: 1.0 wt %).

Synthesis Example 5

Preparation of Solution of Electron Transporting Polymer Compound

An electron transporting polymer compound was dissolved in xylene, to prepare a solution of electron transporting polymer compound (concentration: 0.4 wt %).

Example 1

Manufacturing of Organic Electroluminescent Device

On a glass substrate carrying thereon an ITO film with a thickness of 150 nm formed by a sputtering method, a liquid obtained by filtrating a suspension of poly(3,4)ethylenedioxythiophene/polystyrenesulfonic acid (manufactured by Stark-V TECH, trade name: BaytronP CH8000) through a 0.2 μm membrane filter was spin-coated to form a thin film with a thickness of 60 nm which was then dried on a hot plate at 200° C. for 10 minutes. Next, the mixed solution of hole transporting polymer compound/light emitting material obtained above was spin-coated to form a thin film with a thickness of 40 nm. Then, the film was thermally treated at 200° C. for 15 minutes on a hot plate under a nitrogen atmosphere. On the hole transporting polymer compound layer (first organic layer) containing a light emitting material thus formed, the electron transporting polymer compound solution obtained above was spin-coated to form an electron transporting polymer compound layer (second organic layer). Here, the revolution in spin-coating was controlled so that the total thickness of the hole transporting polymer compound layer and the electron transporting polymer compound layer was about 60 nm. Thereafter, the substrate carrying the first organic layer and second organic layer laminated thereon was heated at 130° C. for 10 minutes on a hot plate under a nitrogen atmosphere to remove the solvent. Thus manufactured device was introduced into a vacuum vapor-deposition machine, and as a cathode, metal barium was vapor-deposited with a thickness of about 5 nm, then, aluminum was vapor-deposited with a thickness of about 80 nm, to manufacture an organic electroluminescent device. After the degree of vacuum reached $1\times10^{-4}$ Pa or lower, metal vapor deposition was initiated. The anode showed a work function of 5.0 eV and the cathode showed a work function of 2.7 eV.

<Evaluation of Organic Electroluminescent Device>
(1) Confirmation of Emission Color By applying voltage to the resultant organic electroluminescent device, red EL light emission was observed from the first organic layer. The light emission luminance when a voltage of 4 V was applied was 82 cd/m$^2$, and the peak wavelength of the light emission spectrum was 625 nm. The values of x and y on the CIE chromatic coordinate were x=0.61 and y=0.34. From the light emission spectrum, it could be confirmed that the red light emission was ascribable to the light emitting material mixed in the hole transporting polymer compound. The current efficiency at this moment was 0.25 cd/A.

(2) Life

The resultant organic electroluminescent device was driven at a constant current of 150 mA/cm$^2$, and change in luminance by time was measured to find an initial luminance of 320 cd/m$^2$ and a time until reduction by half in luminance of 107 hours.

<Evaluation>

The organic electroluminescent device of the present invention obtained in Example 1 shows light emission at a practical luminance of about 100 cd/m$^2$ at a driving voltage of as low as 4 V, and shows a light emission efficiency of as relatively high as 0.25 cd/A at the same voltage. Therefore, the organic electroluminescent device of the present invention is excellent in balance between the light emission efficiency and the driving voltage.

INDUSTRIAL APPLICABILITY

The organic electroluminescent device of the present invention is excellent in balance between the light emission efficiency and the driving voltage. This organic electroluminescent device usually has long life, and shows highly-diverse emission colors. Therefore, the organic electroluminescent device of the present invention is suitable for sheet light sources such as curved light sources, flat light sources and the like (for example, illuminations such as interior illumination and the like); and displays such as segment displays (for example, segment type display and the like), dot matrix displays (for example, dot matrix flat display and the like), liquid crystal displays (for example, liquid crystal display, backlight of liquid crystal display, and the like), advertisement displays and the like.

The invention claimed is:

1. An organic electroluminescent device having electrodes composed of an anode and a cathode, a first organic layer arranged in contact with or adjacent to the anode between the electrodes and containing a hole transporting polymer compound and a second organic layer arranged in contact with the first organic layer between the first organic layer and the cathode and containing an electron transporting polymer compound, wherein the hole transporting polymer compound satisfies the following formula (1):

$$Ip1-Wa<0.5 \text{ eV} \tag{1}$$

wherein, Ip1 represents the absolute value (eV) of the ionization potential of the hole transporting polymer compound, and Wa represents the absolute value (eV) of the work function of the anode, the electron transporting polymer compound satisfies the following formula (2) and the following formula (3):

$$Wc-Ea2<0.5 \text{ eV} \tag{2}$$

$$Ip2-Wa\geq0.5 \text{ eV} \tag{3}$$

wherein, Wc represents the absolute value (eV) of the work function of the cathode, Ea2 represents the absolute value (eV) of the electron affinity of the electron transporting polymer compound, Ip2 represents the absolute value (eV) of the ionization potential of the electron transporting polymer compound, and Wa has the same meaning as described above, at least one of the first organic layer and the second organic layer contains a light emitting material satisfying the following formula (4) and the following formula (5):

$$|Ip3-Ip1|<0.5 \text{ eV} \tag{4}$$

$$|Ea2-Ea3|<1.0 \text{ eV} \tag{5}$$

wherein, Ip3 represents the absolute value (eV) of the ionization potential of the light emitting material, Ea3 represents the absolute value (eV) of the electron affinity of the light emitting material, and Ip1 and Ea2 have the same meanings as described above, and light is emitted from the first organic layer or from the first organic layer and the second organic layer, in a color range in which values of x and y on the CIE chromatic coordinate satisfy the following formula (P) or the following formula (Q):

$$x<0.28 \text{ or } x>0.44 \text{ and } y\geq0 \tag{P}$$

$$0.28\leq x\leq0.44 \text{ and } y\leq0.24 \text{ or } y\geq0.46 \tag{Q};$$

wherein said hole transporting polymer compound comprises a repeating unit of the following formula:

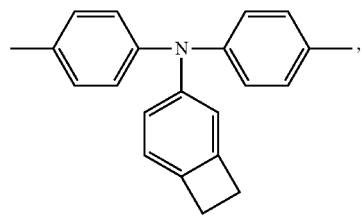

and is molecular-crosslinked by heating or by irradiation with light or electron beam.

2. The organic electroluminescent device according to claim 1, wherein said hole transporting polymer compound has a repeating unit composed of an arylene group optionally having a substituent, and/or a repeating unit composed of a divalent heterocyclic group optionally having a substituent.

3. The organic electroluminescent device according to claim 2, wherein said hole transporting polymer compound has further a repeating unit composed of a divalent residue of an aromatic amine compound optionally having a substituent.

4. The organic electroluminescent device according to claim 2, wherein said repeating unit composed of an arylene group optionally having a substituent is a repeating unit of the following formula (6a):

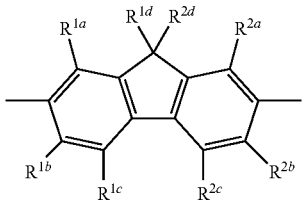

(6a)

wherein, $R^{1a}$, $R^{1b}$, $R^{1c}$, $R^{1d}$, $R^{2a}$, $R^{2b}$, $R^{2c}$ and $R^{2d}$ represent each independently a hydrogen atom, alkyl group having 1 to 20 carbon atoms, alkoxy group having 1 to 20 carbon atoms, phenylalkyl group obtained by substituting an end hydrogen atom of the alkyl group with a phenyl group, phenylalkoxy group obtained by substituting an end hydrogen atom of the alkoxy group with a phenyl group, phenyl group, phenoxy group, alkylphenyl group obtained by substituting one or more hydrogen atoms on the benzene ring with an alkyl group having 1 to 20 carbon atoms, alkoxyphenyl group obtained by substituting one or more hydrogen atoms on the benzene ring with an alkoxy group having 1 to 20 carbon atoms, alkylcarbonyl group having 1 to 20 carbon atoms, alkoxycarbonyl group having 1 to 20 carbon atoms or carboxyl group having 1 to 20 carbon atoms; and here $R^{1b}$ and $R^{1c}$, and $R^{2b}$ and $R^{2c}$ may together form a ring, respectively.

5. The organic electroluminescent device according to claim 2, wherein said repeating unit composed of a divalent heterocyclic group optionally having a substituent is a repeating unit of the following formula (6b):

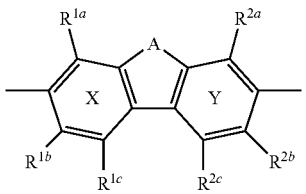

(6b)

wherein, A represents an atom or atomic group forming a 5-membered ring or 6-membered ring together with two carbon atoms on the ring X and two carbon atoms on the ring Y, and $R^{1a}$, $R^{1b}$, $R^{1c}$, $R^{2a}$, $R^{2b}$ and $R^{2c}$ have the same meanings as described above; here, $R^{1b}$ and $R^{1c}$, and $R^{2b}$ and $R^{2c}$ may together form a ring, respectively.

6. The organic electroluminescent device according to claim 4, wherein said repeating unit of the formula (6a) is a repeating unit of the following formula (A):

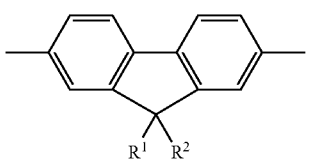

(A)

wherein, $R^1$ and $R^2$ represent each independently a hydrogen atom, alkyl group having 1 to 20 carbon atoms optionally having a substituent, or phenyl group obtained by substituting one or more hydrogen atoms on the benzene ring with an alkyl group having 1 to 20 carbon atoms optionally having a substituent.

7. The organic electroluminescent device according to claim 3, wherein said repeating unit composed of a divalent residue of an aromatic amine compound optionally having a substituent is a repeating unit of the following formula (7):

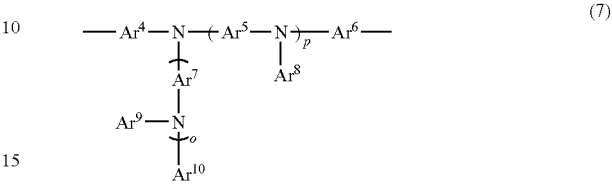

(7)

wherein, $Ar^4$, $Ar^5$, $Ar^6$ and $Ar^7$ represent each independently an arylene group or divalent heterocyclic group; $Ar^8$, $Ar^9$ and $Ar^{10}$ represent each independently an aryl group or monovalent heterocyclic group; o and p represent each independently 0 or 1.

8. The organic electroluminescent device according to claim 7, wherein said repeating unit of the formula (7) is a repeating unit of the following formula (8):

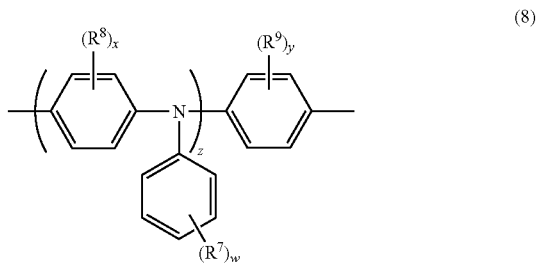

(8)

wherein, $R^7$, $R^8$ and $R^9$ represent each independently an alkyl group having 1 to 20 carbon atoms, alkoxy group having 1 to 20 carbon atoms, phenylalkyl group obtained by substituting an end hydrogen atom of the alkyl group with a phenyl group, phenylalkoxy group obtained by substituting an end hydrogen atom of the alkoxy group with a phenyl group, phenyl group, phenoxy group, alkylphenyl group obtained by substituting one or more hydrogen atoms on the benzene ring with an alkyl group having 1 to 20 carbon atoms, alkoxyphenyl group obtained by substituting one or more hydrogen atoms on the benzene ring with an alkoxy group having 1 to 20 carbon atoms, alkylcarbonyl group having 1 to 20 carbon atoms, alkoxycarbonyl group having 1 to 20 carbon atoms or carboxyl group having 1 to 20 carbon atoms; x and y represent each independently an integer of 0 to 4, z represents 1 or 2, and w represents an integer of 0 to 5; when there exist a plurality of $R^7$s, $R^8$s and $R^9$s respectively, they may be the same or different; and when there exist a plurality of $R^7$s, two $R^7$s may be mutually connected to form a ring.

9. The organic electroluminescent device according to claim 8, wherein said repeating unit of the formula (8) is a repeating unit of the following formula (B):

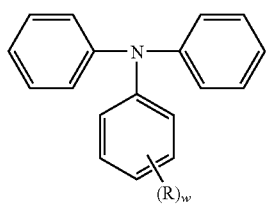

(B)

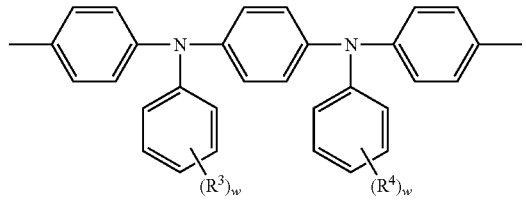

(C)

wherein, R represents an alkyl group having 1 to 20 carbon atoms, and w represents an integer of 0 to 5; when there exist a plurality of Rs, they may be the same or different; and when there exist a plurality of Rs, two Rs may be mutually connected to form a ring.

10. The organic electroluminescent device according to claim 3, wherein the proportion of said repeating unit composed of a divalent residue of an aromatic amine compound optionally having a substituent is 0.1 to 10 mol with respect to 1 mol of the sum of said repeating unit composed of an arylene group optionally having a substituent and said repeating unit composed of divalent heterocyclic group optionally having a substituent.

11. The organic electroluminescent device according to claim 1, wherein said electron transporting polymer compound has a repeating unit composed of an arylene group optionally having a substituent and/or a repeating unit composed of a divalent heterocyclic group optionally having a substituent.

12. The organic electroluminescent device according to claim 11, wherein said electron transporting polymer compound has further a repeating unit composed of a divalent residue of an aromatic amine compound optionally having a substituent.

13. The organic electroluminescent device according to claim 11, wherein said repeating unit composed of an arylene group optionally having a substituent is a repeating unit of the above-described formula (6a).

14. The organic electroluminescent device according to claim 11, wherein said repeating unit composed of a divalent heterocyclic group optionally having a substituent is a repeating unit of the above-described formula (6b).

15. The organic electroluminescent device according to claim 13, wherein said repeating unit of the formula (6a) is a repeating unit of the above-described formula (A).

16. The organic electroluminescent device according to claim 12, wherein said repeating unit composed of a divalent residue of an aromatic amine compound optionally having a substituent is a repeating unit of the above-described formula (7).

17. The organic electroluminescent device according to claim 16, wherein said repeating unit of the formula (7) is a repeating unit of the above-described formula (8).

18. The organic electroluminescent device according to claim 17, wherein said repeating unit of the formula (8) is a repeating unit of the following formula (C):

wherein, $R^3$ and $R^4$ represent each independently an alkyl group having 1 to 20 carbon atoms, and w represents an integer of 0 to 5; a plurality of ws may be the same or different; and when there exist a plurality of $R^3$s and $R^4$s, they may be the same or different.

19. The organic electroluminescent device according to claim 12, wherein the proportion of said repeating unit composed of a divalent residue of an aromatic amine compound optionally having a substituent is over 0 mol and less than 0.1 mol with respect to 1 mol of the sum of said repeating unit composed of an arylene group optionally having a substituent and said repeating unit composed of divalent heterocyclic group optionally having a substituent.

20. A method of producing an organic electroluminescent device having electrodes composed of an anode and a cathode, a first organic layer arranged in contact with or adjacent to the anode between the electrodes and containing a hole transporting polymer compound having a crosslinking group in the molecule and a second organic layer arranged in contact with the first organic layer between the first organic layer and the cathode and containing an electron transporting polymer compound, comprising the steps of:

(A) selecting the hole transporting polymer compound having a crosslinking group in the molecule based on its satisfying the following formula (1):

$$Ip1 - Wa < 0.5 \text{ eV} \quad (1)$$

wherein, Ip1 represents the absolute value (eV) of the ionization potential of the hole transporting polymer compound, and Wa represents the absolute value (eV) of the work function of the anode, and wherein the hole transporting polymer compound comprises a repeating unit of the following formula:

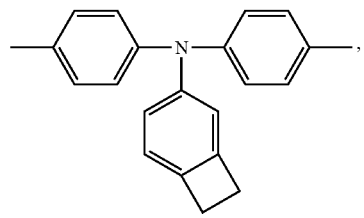

(B) selecting the electron transporting polymer compound based on its satisfying the following formula (2) and the following formula (3):

$$Wc - Ea2 < 0.5 \text{ eV} \quad (2)$$

$$Ip2 - Wa \geq 0.5 \text{ eV} \quad (3)$$

wherein, Wc represents the absolute value (eV) of the work function of the cathode, Ea2 represents the absolute value (eV) of the electron affinity of the electron transporting polymer compound, Ip2 represents the absolute value (eV) of the ionization potential of the electron transporting polymer compound, and Wa has the same meaning as described above, (C) selecting a light emitting material based on its satisfying the following formula (4) and the following formula (5):

$$|Ip3-Ip1|<0.5 \text{ eV} \tag{4}$$

$$|Ea2-Ea3|<1.0 \text{ eV} \tag{5}$$

wherein, Ip3 represents the absolute value (eV) of the ionization potential of the light emitting material, Ea3 represents the absolute value (eV) of the electron affinity of the light emitting material, and Ip1 and Ea2 have the same meanings as described above, wherein at least one of the first organic layer and the second organic layer contains the light emitting material;

and light is emitted from the first organic layer or from the first organic layer and the second organic layer, in a color range in which values of x and y on the CIE chromatic coordinate satisfy the following formula (P) or the following formula (Q):

$$x<0.28 \text{ or } x>0.44 \text{ and } y\geq 0 \tag{P}$$

$$0.28\leq x\leq 0.44 \text{ and } y\leq 0.24 \text{ or } y\geq 0.46 \tag{Q}$$

wherein the method comprises insolubilizing said first organic layer, then, providing the second organic layer in contact with the insolubilized first organic layer.

21. The production method according to claim 20, wherein said process of insolubilizing the first organic layer is performed by heating said hole transporting polymer compound contained in the first organic layer or by irradiating this compound with light or electron beam.

22. A sheet light source obtained by using the organic electroluminescent device as described in claim 1.

23. A display obtained by using the organic electroluminescent device as described in claim 1.

\* \* \* \* \*